US010355852B2

(12) United States Patent
Tajalli

(10) Patent No.: US 10,355,852 B2
(45) Date of Patent: *Jul. 16, 2019

(54) LOCK DETECTOR FOR PHASE LOCK LOOP

(71) Applicant: Kandou Labs, S.A., Lausanne (CH)

(72) Inventor: Armin Tajalli, Salt Lake City, UT (US)

(73) Assignee: KANDOU LABS, S.A., Lausanne (CH)

( * ) Notice: Subject to any disclaimer, the term of this patent is extended or adjusted under 35 U.S.C. 154(b) by 0 days.

This patent is subject to a terminal disclaimer.

(21) Appl. No.: 15/905,614

(22) Filed: Feb. 26, 2018

(65) Prior Publication Data

US 2018/0183566 A1    Jun. 28, 2018

Related U.S. Application Data

(63) Continuation of application No. 15/253,486, filed on Aug. 31, 2016, now Pat. No. 9,906,358.

(51) Int. Cl.
*H04L 7/00* (2006.01)
*H04L 7/033* (2006.01)
(Continued)

(52) U.S. Cl.
CPC ............ *H04L 7/033* (2013.01); *H03L 7/081* (2013.01); *H03L 7/085* (2013.01); *H03L 7/0807* (2013.01);
(Continued)

(58) Field of Classification Search
CPC ....... H04L 7/033; H04L 7/0079; H03L 7/091; H03L 7/099; H03K 19/21
(Continued)

(56) References Cited

U.S. PATENT DOCUMENTS 668,687 A   2/1901 Mayer
780,883 A   1/1905 Hinchman
(Continued)

FOREIGN PATENT DOCUMENTS

CN    1671092    9/2005
CN    1864346    11/2006
(Continued)

OTHER PUBLICATIONS

"Introduction to: Analog Computers and the DSPACE System," Course Material ECE 5230 Spring 2008, Utah State University, www.coursehero.com, 12 pages.
(Continued)

*Primary Examiner* — Helene E Tayong
(74) *Attorney, Agent, or Firm* — Invention Mine LLC

(57) ABSTRACT

Methods and systems are described for generating, using a voltage-controlled oscillator (VCO), a plurality of phases of a local clock signal, generating a phase-error signal using a phase comparator receive a phase of the local clock signal and a reference clock signal, and configured to output the phase-error signal, generating a frequency-lock assist (FLA) signal using a FLA circuit receiving one or more phases of the local clock signal and the reference clock signal, the FLA signal indicative of a magnitude of a frequency error between the reference clock signal and the local clock signal, and generating a VCO control signal using an error accumulator circuit receiving the phase-error signal and the FLA signal, and responsively providing the VCO control signal to the VCO to lock the local clock signal to the reference clock signal.

20 Claims, 13 Drawing Sheets

(51) Int. Cl.
  *H03L 7/095* (2006.01)
  *H03L 7/099* (2006.01)
  *H03L 7/093* (2006.01)
  *H03L 7/091* (2006.01)
  *H03L 7/08* (2006.01)
  *H03L 7/081* (2006.01)
  *H03L 7/085* (2006.01)
  *H03L 7/113* (2006.01)
  *H03L 7/18* (2006.01)
  *H03K 19/21* (2006.01)

(52) U.S. Cl.
  CPC .............. *H03L 7/091* (2013.01); *H03L 7/093* (2013.01); *H03L 7/095* (2013.01); *H03L 7/099* (2013.01); *H03L 7/0995* (2013.01); *H03L 7/113* (2013.01); *H03L 7/18* (2013.01); *H04L 7/0012* (2013.01); *H04L 7/0079* (2013.01); *H03K 19/21* (2013.01); *H04L 7/0025* (2013.01)

(58) Field of Classification Search
  USPC ........................................................ 375/355
  See application file for complete search history.

(56) References Cited

U.S. PATENT DOCUMENTS

| | | | |
|---|---|---|---|
| 3,196,351 | A | 7/1965 | Slepian |
| 3,636,463 | A | 1/1972 | Ongkiehong |
| 3,939,468 | A | 2/1976 | Mastin |
| 4,163,258 | A | 7/1979 | Ebihara |
| 4,181,967 | A | 1/1980 | Nash |
| 4,206,316 | A | 6/1980 | Burnsweig |
| 4,276,543 | A | 6/1981 | Miller |
| 4,414,512 | A | 11/1983 | Nelson |
| 4,486,739 | A | 12/1984 | Franaszek |
| 4,499,550 | A | 2/1985 | Ray, III |
| 4,722,084 | A | 1/1988 | Morton |
| 4,772,845 | A | 9/1988 | Scott |
| 4,774,498 | A | 9/1988 | Traa |
| 4,864,303 | A | 9/1989 | Ofek |
| 4,897,657 | A | 1/1990 | Brubaker |
| 4,974,211 | A | 11/1990 | Corl |
| 5,017,924 | A | 5/1991 | Guiberteau |
| 5,053,974 | A | 10/1991 | Penz |
| 5,166,956 | A | 11/1992 | Baltus |
| 5,168,509 | A | 12/1992 | Nakamura |
| 5,266,907 | A | 11/1993 | Dacus |
| 5,283,761 | A | 2/1994 | Gillingham |
| 5,287,305 | A | 2/1994 | Yoshida |
| 5,311,516 | A | 5/1994 | Kuznicki |
| 5,331,320 | A | 7/1994 | Cideciyan |
| 5,412,689 | A | 5/1995 | Chan |
| 5,449,895 | A | 9/1995 | Hecht |
| 5,459,465 | A | 10/1995 | Kagey |
| 5,461,379 | A | 10/1995 | Weinman |
| 5,510,736 | A | 4/1996 | Van De Plassche |
| 5,511,119 | A | 4/1996 | Lechleider |
| 5,528,198 | A | 6/1996 | Baba |
| 5,553,097 | A | 9/1996 | Dagher |
| 5,566,193 | A | 10/1996 | Cloonan |
| 5,599,550 | A | 2/1997 | Kohlruss |
| 5,626,651 | A | 5/1997 | Dullien |
| 5,629,651 | A | 5/1997 | Mizuno |
| 5,659,353 | A | 8/1997 | Kostreski |
| 5,727,006 | A | 3/1998 | Dreyer |
| 5,748,948 | A | 5/1998 | Yu |
| 5,802,356 | A | 9/1998 | Gaskins |
| 5,825,808 | A | 10/1998 | Hershey |
| 5,856,935 | A | 1/1999 | Moy |
| 5,875,202 | A | 2/1999 | Venters |
| 5,945,935 | A | 8/1999 | Kusumoto |
| 5,949,060 | A | 9/1999 | Schattschneider |
| 5,982,954 | A | 11/1999 | Delen |
| 5,995,016 | A | 11/1999 | Perino |
| 6,005,895 | A | 12/1999 | Perino |
| 6,084,883 | A | 7/2000 | Norrell |
| 6,119,263 | A | 9/2000 | Mowbray |
| 6,172,634 | B1 | 1/2001 | Leonowich |
| 6,175,230 | B1 | 1/2001 | Hamblin |
| 6,232,908 | B1 | 5/2001 | Nakaigawa |
| 6,278,740 | B1 | 8/2001 | Nordyke |
| 6,307,906 | B1 | 10/2001 | Tanji |
| 6,316,987 | B1 | 11/2001 | Dally |
| 6,346,907 | B1 | 2/2002 | Dacy |
| 6,359,931 | B1 | 3/2002 | Perino |
| 6,378,073 | B1 | 4/2002 | Davis |
| 6,380,783 | B1 | 4/2002 | Chao et al. |
| 6,384,758 | B1 | 5/2002 | Michalski |
| 6,389,091 | B1 | 5/2002 | Yamaguchi |
| 6,398,359 | B1 | 6/2002 | Silverbrook |
| 6,404,820 | B1 | 6/2002 | Postol |
| 6,417,737 | B1 | 7/2002 | Moloudi |
| 6,433,800 | B1 | 8/2002 | Holtz |
| 6,452,420 | B1 | 9/2002 | Wong |
| 6,473,877 | B1 | 10/2002 | Sharma |
| 6,483,828 | B1 | 11/2002 | Balachandran |
| 6,504,875 | B2 | 1/2003 | Perino |
| 6,509,773 | B2 | 1/2003 | Buchwald |
| 6,522,699 | B1 | 2/2003 | Anderson |
| 6,556,628 | B1 | 4/2003 | Poulton |
| 6,563,382 | B1 | 5/2003 | Yang |
| 6,621,427 | B2 | 9/2003 | Greenstreet |
| 6,624,699 | B2 | 9/2003 | Yin |
| 6,650,638 | B1 | 11/2003 | Walker |
| 6,661,355 | B2 | 12/2003 | Cornelius |
| 6,664,355 | B2 | 12/2003 | Kim |
| 6,686,879 | B2 | 2/2004 | Shattil |
| 6,690,739 | B1 | 2/2004 | Mui |
| 6,717,478 | B1 | 4/2004 | Kim |
| 6,766,342 | B2 | 7/2004 | Kechriotis |
| 6,772,351 | B1 | 8/2004 | Werner |
| 6,839,429 | B1 | 1/2005 | Gaikwad |
| 6,839,587 | B2 | 1/2005 | Yonce |
| 6,854,030 | B2 | 2/2005 | Perino |
| 6,865,234 | B1 | 3/2005 | Agazzi |
| 6,865,236 | B1 | 3/2005 | Terry |
| 6,876,317 | B2 | 4/2005 | Sankaran |
| 6,898,724 | B2 | 5/2005 | Chang |
| 6,927,709 | B2 | 8/2005 | Kiehl |
| 6,954,492 | B1 | 10/2005 | Williams |
| 6,963,622 | B2 | 11/2005 | Eroz |
| 6,972,701 | B2 | 12/2005 | Jansson |
| 6,973,613 | B2 | 12/2005 | Cypher |
| 6,976,194 | B2 | 12/2005 | Cypher |
| 6,982,954 | B2 | 1/2006 | Dhong |
| 6,990,138 | B2 | 1/2006 | Bejjani |
| 6,993,311 | B2 | 1/2006 | Li |
| 6,999,516 | B1 | 2/2006 | Rajan |
| 7,023,817 | B2 | 4/2006 | Kuffner |
| 7,039,136 | B2 | 5/2006 | Olson |
| 7,053,802 | B2 | 5/2006 | Cornelius |
| 7,075,996 | B2 | 7/2006 | Simon |
| 7,080,288 | B2 | 7/2006 | Ferraiolo |
| 7,082,557 | B2 | 7/2006 | Schauer |
| 7,085,153 | B2 | 8/2006 | Ferrant |
| 7,085,336 | B2 | 8/2006 | Lee |
| 7,127,003 | B2 | 10/2006 | Rajan |
| 7,130,944 | B2 | 10/2006 | Perino |
| 7,142,612 | B2 | 11/2006 | Horowitz |
| 7,142,865 | B2 | 11/2006 | Tsai |
| 7,164,631 | B2 | 1/2007 | Tateishi |
| 7,167,019 | B2 | 1/2007 | Broyde |
| 7,176,823 | B2 | 2/2007 | Zabroda |
| 7,180,949 | B2 | 2/2007 | Kleveland |
| 7,184,483 | B2 | 2/2007 | Rajan |
| 7,199,728 | B2 | 4/2007 | Dally |
| 7,231,558 | B2 | 6/2007 | Gentieu |
| 7,269,130 | B2 | 9/2007 | Pitio |
| 7,269,212 | B1 | 9/2007 | Chau |
| 7,335,976 | B2 | 2/2008 | Chen |
| 7,336,112 | B1 | 2/2008 | Sha |
| 7,339,990 | B2 | 3/2008 | Hidaka |

(56) References Cited

U.S. PATENT DOCUMENTS

| | | |
|---|---|---|
| 7,346,819 B2 | 3/2008 | Bansal |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |
| 7,362,130 B2 | 4/2008 | Broyde |
| 7,362,697 B2 | 4/2008 | Becker |
| 7,366,942 B2 | 4/2008 | Lee |
| 7,370,264 B2 | 5/2008 | Worley |
| 7,372,390 B2 | 5/2008 | Yamada |
| 7,389,333 B2 | 6/2008 | Moore |
| 7,397,302 B2 | 7/2008 | Bardsley |
| 7,400,276 B1 | 7/2008 | Sotiriadis |
| 7,428,273 B2 | 9/2008 | Foster |
| 7,456,778 B2 | 11/2008 | Werner |
| 7,462,956 B2 | 12/2008 | Lan |
| 7,496,162 B2 | 2/2009 | Srebranig |
| 7,570,704 B2 | 4/2009 | Nagarajan |
| 7,535,957 B2 | 5/2009 | Ozawa |
| 7,539,532 B2 | 5/2009 | Tran |
| 7,599,390 B2 | 10/2009 | Pamarti |
| 7,613,234 B2 | 11/2009 | Raghavan |
| 7,616,075 B2 | 11/2009 | Kushiyama |
| 7,620,116 B2 | 11/2009 | Bessios |
| 7,633,850 B2 | 12/2009 | Nagarajan |
| 7,639,596 B2 | 12/2009 | Cioffi |
| 7,643,588 B2 | 1/2010 | Visalli |
| 7,650,525 B1 | 1/2010 | Chang |
| 7,656,321 B2 | 2/2010 | Wang |
| 7,688,929 B2 | 3/2010 | Co |
| 7,694,204 B2 | 4/2010 | Schmidt |
| 7,697,915 B2 | 4/2010 | Behzad |
| 7,698,088 B2 | 4/2010 | Sul |
| 7,706,456 B2 | 4/2010 | Laroia |
| 7,706,524 B2 | 4/2010 | Zerbe |
| 7,746,764 B2 | 6/2010 | Rawlins |
| 7,768,312 B2 | 8/2010 | Hirose |
| 7,787,572 B2 | 8/2010 | Scharf |
| 7,804,361 B2 | 9/2010 | Lim |
| 7,808,456 B2 | 10/2010 | Chen |
| 7,808,883 B2 | 10/2010 | Green |
| 7,841,909 B2 | 11/2010 | Murray |
| 7,860,190 B2 | 12/2010 | Feller |
| 7,869,497 B2 | 1/2011 | Benvenuto |
| 7,869,546 B2 | 1/2011 | Tsai |
| 7,882,413 B2 | 2/2011 | Chen |
| 7,899,653 B2 | 3/2011 | Hollis |
| 7,907,676 B2 | 3/2011 | Stojanovic |
| 7,933,770 B2 | 4/2011 | Kruger |
| 8,000,664 B2 | 8/2011 | Khorram |
| 8,030,999 B2 | 10/2011 | Chatterjee |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,149,906 B2 | 4/2012 | Saito |
| 8,159,375 B2 | 4/2012 | Abbasfar |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | AbouRjeily |
| 8,233,544 B2 | 7/2012 | Bao |
| 8,245,094 B2 | 8/2012 | Jiang |
| 8,253,454 B2 | 8/2012 | Lin |
| 8,279,094 B2 | 10/2012 | Abbasfar |
| 8,279,745 B2 | 10/2012 | Dent |
| 8,289,914 B2 | 10/2012 | Li |
| 8,295,250 B2 | 10/2012 | Gorokhov |
| 8,295,336 B2 | 10/2012 | Lutz |
| 8,305,247 B2 | 11/2012 | Pun |
| 8,310,389 B1 | 11/2012 | Chui |
| 8,341,492 B2 | 12/2012 | Shen |
| 8,359,445 B2 | 1/2013 | Ware |
| 8,365,035 B2 | 1/2013 | Hara |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |
| 8,462,891 B2 | 6/2013 | Kizer |
| 8,472,513 B2 | 6/2013 | Malipatil |
| 8,620,166 B2 | 6/2013 | Dong |
| 8,498,344 B2 | 7/2013 | Wilson |
| 8,498,368 B1 | 7/2013 | Husted |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,602,643 B2 | 12/2013 | Gardiner |
| 8,604,879 B2 | 12/2013 | Mourant |
| 8,638,241 B2 | 1/2014 | Sudhakaran |
| 8,643,437 B2 | 2/2014 | Chiu |
| 8,649,445 B2 | 2/2014 | Cronie |
| 8,649,460 B2 | 2/2014 | Ware |
| 8,674,861 B2 | 3/2014 | Matsuno |
| 8,687,968 B2 | 4/2014 | Nosaka |
| 8,711,919 B2 | 4/2014 | Kumar |
| 8,718,184 B1 | 5/2014 | Cronie |
| 8,744,012 B1 | 6/2014 | Ding |
| 8,755,426 B1 | 6/2014 | Cronie |
| 8,773,964 B2 | 7/2014 | Hsueh |
| 8,780,687 B2 | 7/2014 | Clausen |
| 8,782,578 B2 | 7/2014 | Tell |
| 8,791,735 B1 | 7/2014 | Shibasaki |
| 8,831,440 B2 | 9/2014 | Yu |
| 8,841,936 B2 | 9/2014 | Nakamura |
| 8,879,660 B1 | 11/2014 | Peng |
| 8,897,134 B2 | 11/2014 | Kern |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,975,948 B2 | 3/2015 | GonzalezDiaz |
| 8,989,317 B1 | 3/2015 | Holden |
| 9,015,566 B2 | 4/2015 | Cronie |
| 9,020,049 B2 | 4/2015 | Schwager |
| 9,036,764 B1 | 5/2015 | Hossain |
| 9,059,816 B1 | 6/2015 | Simpson |
| 9,069,995 B1 | 6/2015 | Cronie |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |
| 9,106,465 B2 | 8/2015 | Walter |
| 9,124,557 B2 | 9/2015 | Fox |
| 9,148,087 B1 | 9/2015 | Tajalli |
| 9,148,198 B1 | 9/2015 | Zhang |
| 9,152,495 B2 | 10/2015 | Losh |
| 9,165,615 B2 | 10/2015 | Amirkhany |
| 9,172,412 B2 | 10/2015 | Kim |
| 9,178,503 B2 | 11/2015 | Hsieh |
| 9,183,085 B1 | 11/2015 | Northcott |
| 9,197,470 B2 | 11/2015 | Okunev |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,300,503 B1 | 3/2016 | Holden |
| 9,306,621 B2 | 4/2016 | Zhang |
| 9,331,962 B2 | 5/2016 | Lida |

(56) References Cited

U.S. PATENT DOCUMENTS

| | | |
|---|---|---|
| 9,362,974 B2 | 6/2016 | Fox |
| 9,363,114 B2 | 6/2016 | Shokrollahi |
| 9,374,250 B1 | 6/2016 | Musah |
| 9,401,828 B2 | 7/2016 | Cronie |
| 9,432,082 B2 | 8/2016 | Ulrich |
| 9,432,298 B1 | 8/2016 | Smith |
| 9,444,654 B2 | 9/2016 | Hormati |
| 9,455,744 B2 | 9/2016 | George |
| 9,455,765 B2 | 9/2016 | Schumacher |
| 9,461,862 B2 | 10/2016 | Holden |
| 9,479,369 B1 | 10/2016 | Shokrollahi |
| 9,509,437 B2 | 11/2016 | Shokrollahi |
| 9,520,883 B2 | 12/2016 | Shibasaki |
| 9,544,015 B2 | 1/2017 | Ulrich |
| 9,565,036 B2 | 2/2017 | Zerbe |
| 9,634,797 B2 | 4/2017 | Benammar |
| 9,667,379 B2 | 5/2017 | Cronie |
| 9,917,711 B2 | 3/2018 | Ulrich |
| 2001/0006538 A1 | 7/2001 | Simon |
| 2001/0055344 A1 | 12/2001 | Lee |
| 2002/0034191 A1 | 3/2002 | Shattil |
| 2002/0044316 A1 | 4/2002 | Myers |
| 2002/0057592 A1 | 5/2002 | Robb |
| 2002/0154633 A1 | 10/2002 | Shin |
| 2002/0163881 A1 | 11/2002 | Dhong |
| 2002/0167339 A1 | 11/2002 | Chang |
| 2002/0174373 A1 | 11/2002 | Chang |
| 2002/0181607 A1 | 12/2002 | Izumi |
| 2003/0016763 A1 | 1/2003 | Doi |
| 2003/0016770 A1 | 1/2003 | Trans |
| 2003/0046618 A1 | 3/2003 | Collins |
| 2003/0085763 A1 | 5/2003 | Schrodinger |
| 2003/0146783 A1 | 8/2003 | Bandy |
| 2003/0174023 A1 | 9/2003 | Miyasita |
| 2003/0185310 A1 | 10/2003 | Ketchum |
| 2003/0218558 A1 | 11/2003 | Mulder |
| 2004/0027185 A1 | 2/2004 | Fiedler |
| 2004/0092240 A1 | 5/2004 | Hayashi |
| 2004/0146117 A1 | 7/2004 | Subramaniam |
| 2004/0155802 A1 | 8/2004 | Lamy |
| 2004/0161019 A1 | 8/2004 | Raghavan |
| 2004/0169529 A1 | 9/2004 | Afghahi |
| 2004/0170231 A1 | 9/2004 | Bessios |
| 2005/0024117 A1 | 2/2005 | Kubo |
| 2005/0057379 A1 | 3/2005 | Jansson |
| 2005/0063493 A1 | 3/2005 | Foster |
| 2005/0128018 A1 | 6/2005 | Meltzer |
| 2005/0134380 A1 | 6/2005 | Nairn |
| 2005/0149833 A1 | 7/2005 | Worley |
| 2005/0174841 A1 | 8/2005 | Ho |
| 2005/0195000 A1 | 9/2005 | Parker |
| 2005/0201491 A1 | 9/2005 | Wei |
| 2005/0213686 A1 | 9/2005 | Love |
| 2005/0220182 A1 | 10/2005 | Kuwata |
| 2005/0270098 A1 | 12/2005 | Zhang |
| 2005/0275470 A1 | 12/2005 | Choi |
| 2006/0036668 A1 | 2/2006 | Jaussi |
| 2006/0097786 A1 | 5/2006 | Su |
| 2006/0103463 A1 | 5/2006 | Lee |
| 2006/0120486 A1 | 6/2006 | Visalli |
| 2006/0126751 A1 | 6/2006 | Bessios |
| 2006/0133538 A1 | 6/2006 | Stojanovic |
| 2006/0140324 A1 | 6/2006 | Casper |
| 2006/0159005 A1 | 7/2006 | Rawlins |
| 2006/0232461 A1 | 10/2006 | Felder |
| 2006/0233291 A1 | 10/2006 | Garlepp |
| 2006/0291589 A1 | 12/2006 | Eliezer |
| 2007/0001713 A1 | 1/2007 | Lin |
| 2007/0001723 A1 | 1/2007 | Lin |
| 2007/0002954 A1 | 1/2007 | Cornelius |
| 2007/0030796 A1 | 2/2007 | Green |
| 2007/0076871 A1 | 4/2007 | Renes |
| 2007/0103338 A1 | 5/2007 | Teo |
| 2007/0121716 A1 | 5/2007 | Nagarajan |
| 2007/0182487 A1 | 8/2007 | Ozasa |
| 2007/0188367 A1 | 8/2007 | Yamada |
| 2007/0201546 A1 | 8/2007 | Lee |
| 2007/0201597 A1 | 8/2007 | He |
| 2007/0204205 A1 | 8/2007 | Niu |
| 2007/0263711 A1 | 11/2007 | Kramer |
| 2007/0283210 A1 | 12/2007 | Prasad |
| 2008/0007367 A1 | 1/2008 | Kim |
| 2008/0012598 A1 | 1/2008 | Mayer |
| 2008/0104374 A1 | 5/2008 | Mohamed |
| 2008/0159448 A1 | 7/2008 | Anim-Appiah |
| 2008/0192621 A1 | 8/2008 | Suehiro |
| 2008/0317188 A1 | 12/2008 | Staszewski |
| 2009/0059782 A1 | 3/2009 | Cole |
| 2009/0115523 A1 | 5/2009 | Akizuki |
| 2009/0154604 A1 | 6/2009 | Lee |
| 2009/0193159 A1 | 7/2009 | Li |
| 2009/0195281 A1 | 8/2009 | Tamura |
| 2009/0262876 A1 | 10/2009 | Arima |
| 2009/0316730 A1 | 12/2009 | Feng |
| 2009/0323864 A1 | 12/2009 | Tired |
| 2010/0046644 A1 | 2/2010 | Mazet |
| 2010/0081451 A1 | 4/2010 | Mueck |
| 2010/0148819 A1 | 6/2010 | Bae |
| 2010/0180143 A1 | 7/2010 | Ware |
| 2010/0215087 A1 | 8/2010 | Tsai |
| 2010/0215112 A1 | 8/2010 | Tsai |
| 2010/0220828 A1 | 9/2010 | Fuller |
| 2010/0235673 A1 | 9/2010 | Abbasfar |
| 2010/0271107 A1 | 10/2010 | Tran |
| 2010/0283894 A1 | 11/2010 | Horan |
| 2010/0296556 A1 | 11/2010 | Rave |
| 2010/0309964 A1 | 12/2010 | Oh |
| 2010/0329325 A1 | 12/2010 | Mobin |
| 2011/0014865 A1 | 1/2011 | Seo |
| 2011/0028089 A1 | 2/2011 | Komori |
| 2011/0032977 A1 | 2/2011 | Hsiao |
| 2011/0051854 A1 | 3/2011 | Kizer |
| 2011/0072330 A1 | 3/2011 | Kolze |
| 2011/0074488 A1 | 3/2011 | Broyde |
| 2011/0084737 A1 | 4/2011 | Oh |
| 2011/0103508 A1 | 5/2011 | Mu |
| 2011/0127990 A1 | 6/2011 | Wilson |
| 2011/0156757 A1 | 6/2011 | Hayashi |
| 2011/0228864 A1 | 9/2011 | Aryanfar |
| 2011/0235501 A1 | 9/2011 | Goulahsen |
| 2011/0268225 A1 | 11/2011 | Cronie |
| 2011/0299555 A1 | 12/2011 | Cronie |
| 2011/0302478 A1 | 12/2011 | Cronie |
| 2011/0317559 A1 | 12/2011 | Kern |
| 2012/0082203 A1 | 4/2012 | Zerbe |
| 2012/0133438 A1 | 5/2012 | Tsuchi |
| 2012/0152901 A1 | 6/2012 | Nagorny |
| 2012/0161945 A1 | 6/2012 | Single |
| 2012/0213299 A1 | 8/2012 | Cronie |
| 2012/0257683 A1 | 10/2012 | Schwager |
| 2012/0327993 A1 | 12/2012 | Palmer |
| 2013/0010892 A1 | 1/2013 | Cronie |
| 2013/0013870 A1 | 1/2013 | Cronie |
| 2013/0088274 A1 | 4/2013 | Gu |
| 2013/0106513 A1 | 5/2013 | Cyrusian |
| 2013/0114519 A1 | 5/2013 | Gaal |
| 2013/0114663 A1 | 5/2013 | Ding |
| 2013/0129019 A1 | 5/2013 | Sorrells |
| 2013/0147553 A1 | 6/2013 | Iwamoto |
| 2013/0188656 A1 | 7/2013 | Ferraiolo |
| 2013/0195155 A1 | 8/2013 | Pan |
| 2013/0202065 A1 | 8/2013 | Chmelar |
| 2013/0215954 A1 | 8/2013 | Beukema |
| 2013/0259113 A1 | 10/2013 | Kumar |
| 2013/0271194 A1 | 10/2013 | Pellerano |
| 2013/0285720 A1 | 10/2013 | Jibry |
| 2013/0307614 A1 | 11/2013 | Dai |
| 2013/0314142 A1 | 11/2013 | Tamura |
| 2013/0315501 A1 | 11/2013 | Atanassov |
| 2013/0346830 A1 | 12/2013 | Ordentlich |
| 2014/0159769 A1 | 6/2014 | Hong |
| 2014/0177645 A1 | 6/2014 | Cronie |
| 2014/0177696 A1 | 6/2014 | Hwang |
| 2014/0254642 A1 | 9/2014 | Fox |

(56) References Cited

U.S. PATENT DOCUMENTS

| | | |
|---|---|---|
| 2014/0266440 A1 | 9/2014 | Itagaki |
| 2014/0269130 A1 | 9/2014 | Maeng |
| 2014/0286381 A1 | 9/2014 | Shibasaki |
| 2015/0049798 A1 | 2/2015 | Hossein |
| 2015/0070201 A1 | 3/2015 | Dedic |
| 2015/0078479 A1 | 3/2015 | Whitby-Strevens |
| 2015/0078495 A1 | 3/2015 | Hossain |
| 2015/0117579 A1 | 4/2015 | Shibasaki |
| 2015/0146771 A1 | 5/2015 | Walter |
| 2015/0180642 A1 | 6/2015 | Hsieh |
| 2015/0222458 A1 | 8/2015 | Hormati |
| 2015/0249559 A1 | 9/2015 | Shokrollahi |
| 2015/0256326 A1 | 9/2015 | Simpson |
| 2015/0333940 A1 | 11/2015 | Shokrollahi |
| 2015/0349835 A1 | 12/2015 | Fox |
| 2015/0380087 A1 | 12/2015 | Mittelholzer |
| 2015/0381232 A1 | 12/2015 | Ulrich |
| 2016/0020796 A1 | 1/2016 | Hormati |
| 2016/0020824 A1 | 1/2016 | Ulrich |
| 2016/0036616 A1 | 2/2016 | Holden |
| 2016/0197747 A1 | 7/2016 | Ulrich |
| 2016/0261435 A1 | 9/2016 | Musah |
| 2017/0310456 A1 | 10/2017 | Tajalli |
| 2017/0317449 A1 | 11/2017 | Shokrollahi |
| 2017/0317855 A1 | 11/2017 | Shokrollahi |

FOREIGN PATENT DOCUMENTS

| | | |
|---|---|---|
| CN | 101478286 | 7/2009 |
| CN | 203675093 U | 6/2014 |
| EP | 1926267 | 5/2008 |
| EP | 2039221 | 2/2013 |
| JP | 2003163612 | 6/2003 |
| WO | 2005002162 | 1/2005 |
| WO | 2009084121 | 7/2009 |
| WO | 2010031824 | 3/2010 |
| WO | 2011119359 | 9/2011 |

OTHER PUBLICATIONS

Abbasfar, A., "Generalized Differential Vector Signaling", IEEE International Conference on Communications, ICC '09, (Jun. 14, 2009), pp. 1-5.
Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.
Burr, "Spherical Codes for M-ARY Code Shift Keying", University of York, Apr. 2, 1989, pp. 67-72, United Kingdom.
Cheng, W., "Memory Bus Encoding for Low Power: A Tutorial", Quality Electronic Design, IEEE, International Symposium on Mar. 26-28, 2001, pp. 199-204, Piscataway, NJ.
Clayton, P., "Introduction to Electromagnetic Compatibility", Wiley-Interscience, 2006.
Counts, L., et al., "One-Chip Slide Rule Works with Logs, Antilogs for Real-Time Processing," Analog Devices Computational Products 6, Reprinted from Electronic Design, May 2, 1985, 7 pages.
Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.
Design Brief 208 Using the Anadigm Multiplier CAM, Copyright 2002 Anadigm, 6 pages.
Ericson, T., et al., "Spherical Codes Generated by Binary Partitions of Symmetric Pointsets", IEEE Transactions on Information Theory, vol. 41, No. 1, Jan. 1995, pp. 107-129.
Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.
Grahame, J., "Vintage Analog Computer Kits," posted on Aug. 25, 2006 in Classic Computing, 2 pages, http://www.retrothing.com/2006/08/classic_analog_.html.
Healey, A., et al., "A Comparison of 25 Gbps NRZ & PAM-4 Modulation used in Legacy & Premium Backplane Channels", DesignCon 2012, 16 pages.
International Search Report and Written Opinion for PCT/EP2011/059279 dated Sep. 22, 2011.
International Search Report and Written Opinion for PCT/EP2011/074219 dated Jul. 4, 2012.
International Search Report and Written Opinion for PCT/EP2012/052767 dated May 11, 2012.
International Search Report and Written Opinion for PCT/US14/052986 dated Nov. 24, 2014.
International Search Report and Written Opinion from PCT/US2014/034220 dated Aug. 21, 2014.
International Search Report and Written Opinion of the International Searching Authority, dated Jul. 14, 2011 in International Patent Application S.N. PCT/EP2011/002170, 10 pages.
International Search Report and Written Opinion of the International Searching Authority, dated Nov. 5, 2012, in International Patent Application S.N. PCT/EP2012/052767, 7 pages.
International Search Report for PCT/US2014/053563, dated Nov. 11, 2014, 2 pages.
Jiang, A., et al., "Rank Modulation for Flash Memories", IEEE Transactions of Information Theory, Jun. 2006, vol. 55, No. 6, pp. 2659-2673.
Loh, M., et al., "A 3x×9 Gb/s Shared, All-Digital CDR for High-Speed, High-Density I/O", Matthew Loh, IEEE Journal of Solid-State Circuits, Vo. 47, No. 3, Mar. 2012.
Notification of Transmittal of International Search Report and the Written Opinion of the International Searching Authority, for PCT/US2015/018363, dated Jun. 18, 2015, 13 pages.
Notification of Transmittal of the International Search Report and the Written Opinion of the International Searching Authority, or the Declaration for PCT/EP2013/002681, dated Feb. 25, 2014, 15 pages.
Notification of Transmittal of the International Search Report and the Written Opinion of the International Searching Authority, or the Declaration, dated Mar. 3, 2015, for PCT/US2014/066893, 9 pages.
Notification of Transmittal of the International Search Report and the Written Opinion of the International Searching Authority, or the Declaration, for PCT/US2014/015840, dated May 20, 2014. 11 pages.
Notification of Transmittal of the International Search Report and the Written Opinion of the International Searching Authority, or the Declaration, for PCT/US2014/043965, dated Oct. 22, 2014, 10 pages.
Notification of Transmittal of the International Search Report and the Written Opinion of the International Searching Authority, or the Declaration, for PCT/US2015/037466, dated Nov. 19, 2015.
Notification of Transmittal of the International Search Report and the Written Opinion of the International Searching Authority, or the Declaration, for PCT/US2015/039952, dated Sep. 23, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/043463, dated Oct. 16, 2015, 8 pages.
Oh, et al., Pseudo-Differential Vector Signaling for Noise Reduction in Single-Ended Signaling, DesignCon 2009.
Poulton, et al., "Multiwire Differential Signaling", UNC-CH Department of Computer Science Version 1.1, Aug. 6, 2003.
Schneider, J., et al., "ELEC301 Project: Building an Analog Computer," Dec. 19, 1999, 8 pages, http://www.clear.rice.edu/elec301/Projects99/anlgcomp/.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Skliar et al., A Method for the Analysis of Signals: the Square-Wave Method, Mar. 2008, Revista de Matematica: Teoria y Aplicationes, pp. 109-129.

(56) References Cited

OTHER PUBLICATIONS

Slepian, D., "Prennutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallini, L., et al., "Transmission Time Analysis for the Parallel Asynchronous Communication Scheme", IEEE Transactions on Computers, vol. 52, No. 5, May 2003, pp. 558-571.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
Zouhair Ben-Neticha et al, "The streTched-Golay and other codes for high-SNR fnite-delay quantization of the Gaussian source at 1/2 Bit per sample", IEEE Transactions on Communications, vol. 38, No. 12 Dec. 1, 1990, pp. 2089-2093, XP000203339, ISSN: 0090-6678, DOI: 10.1109/26.64647.
Notification of Transmittal of the International Search Report and the Written Opinion of the International Searching Authority, or the Declaration, dated Feb. 15, 2017, 10 pages.
Notification of Transmittal of the International Search Report and the Written Opinion of the International Searching Authority, or the Declaration., for PCT/US17/14997, dated Apr. 7, 2017.
Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.
Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.
Holden, B., "Using Ensemble NRZ Coding for 400GE Electrical Interfaces", IEEE 802.3 400GE Study Group, May 17, 2013, 24 pages, http://www.ieee802.org/3/400GSG/public/13_05/holden_400_01_0513.pdf.
Farzan, et al., "Coding Schemes for Chip-to-Chip Interconnect Applications", IEEE Transactions on Very Large Scale Integration (VLSI) Systems, vol. 14, pp. 393-406, Apr. 2006.
Anonymous, "Constant-weight code", Wikipedia.org, retrieved on Jun. 2, 2017.
Reza Navid et al, "A 40 Gb/s Serial Link Transceiver in 28 nm CMOS Technology", IEEE Journal of Solid-State Circuits, vol. 50, No. 4. Apr. 2015, pp. 814-827.
Linten, D. et al, "T-Diodes—A Novel Plus-and-Play Wideband RF Circuit ESD Protection Methodology" EOS/ESD Symposium 07, pp. 242-249.
Hyosup Won et al, "A 28-Gb/s Receiver With Self-contained Adaptive Equalization and Sampling Point Control Using Stochastic Sigma-Tracking Eye-Opening Monitor", IEEE Transactions on Circuits and Systems-I: Regular Papers, vol. 64, No. 3, Mar. 2017. pages 664-674.
Giovaneli, et al., "Space-frequency coded OFDM system for multi-wire power line communications", Power Line Communications and Its Applications, 20015 International Symposium on Vancouver, BC, Canada, Apr. 6-8, 2005, Piscataway, NJ, pp. 191-195.
Shibasaki, et al., "A 56-Gb/s Receiver Front-End with a CTLE and 1-Tap DFE in 20-nm CMOS", IEEE 2014 Symposium on VLSI Circuits Digest of Technical Papers, 2 pgs.
Hidaka, et al., "A 4-Channel 1.25-10.3 Gb/s Backplane Transceiver Macro With35 dB Equalizer and Sign-Based Zero-Forcing Adaptive Control", IEEE Journal of Solid-State Circuits, vol. 44 No. 12, Dec. 2009, pp. 3547-3559.

LOCK DETECTOR FOR PHASE LOCK LOOP

This application is a continuation of U.S. application Ser. No. 15/253,486, filed Aug. 31, 2016, naming Armin Tajalli, entitled, "Lock Detector for Phase Lock Loop," which is hereby incorporated by reference herein in its entirety for all purposes.

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III").

U.S. patent application Ser. No. 13/176,657, filed Jul. 5, 2011, naming Harm Cronie and Amin Shokrollahi, entitled "Methods and Systems for Low-power and Pin-efficient Communications with Superposition Signaling Codes" (hereinafter "Cronie IV").

U.S. patent application Ser. No. 13/542,599, filed Jul. 5, 2012, naming Armin Tajalli, Harm Cronie, and Amin Shokrollahi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, naming Richard Simpson, Andrew Stewart, and Ali Hormati, entitled "Clock Data Alignment System for Vector Signaling Code Communications Link", hereinafter identified as [Stewart I].

U.S. patent application Ser. No. 14/925,686, filed Oct. 28, 2015, naming Armin Tajalli, entitled "Advanced Phase Interpolator", hereinafter identified as [Tajalli II].

U.S. Provisional Patent Application No. 62/286,717, filed Jan. 25, 2016, naming Armin Tajalli, entitled "Voltage Sampler Driver with Enhanced High-Frequency Gain", hereinafter identified as [Tajalli III].

The following additional references to prior art have been cited in this application:

"Linear phase detection using two-phase latch", A. Tajalli, et al., IEE Electronic Letters, 2003, (hereafter called [Tajalli IV].)

FIELD OF THE INVENTION

The present embodiments relate to communications systems circuits generally, and more particularly to obtaining a stable, correctly phased receiver clock signal from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device must be sampled (or their signal value otherwise recorded) at intervals best representing the original transmitted values, regardless of transmission channel delays, interference, and noise. This Clock and Data Recovery (CDR) not only must determine the appropriate sample timing, but must continue to do so continuously, providing dynamic compensation for varying signal propagation conditions.

Many known CDR systems utilize a Phase-Locked Loop (PLL) or Delay-Locked Loop (DLL) to synthesize a local receive clock having an appropriate frequency and phase for accurate receive data sampling.

BRIEF DESCRIPTION

To reliably detect the data values transmitted over a communications system, a receiver must accurately measure the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream.

In general, the receiver embodiments of such timing methods are described as Clock-Data Recovery (CDR), often based on Phase-Lock Loop (PLL) or Delay-Locked Loop (DLL) synthesis of a local receive clock having the desired frequency and phase characteristics.

In both PLL and DLL embodiments, a Phase Detector compares the relative phase (and in some variations, the relative frequency) of a received reference signal and a local clock signal to produce an error signal, which is subsequently used to correct the phase and/or frequency of the local clock source and thus minimize the error. As this feedback loop behavior will lead to a given PLL embodiment producing a fixed phase relationship (as examples, 0 degrees or 90 degrees of phase offset) between the reference signal and the local clock, an additional fixed or variable phase adjustment is often introduced to permit the phase offset to be set to a different desired value (as one example, 45 degrees of phase offset) to facilitate receiver data detection.

In some embodiments, the operating range of the local clock source may be sufficiently wide that a phase lock may occur between harmonic multiples of the reference and local clock signals (e.g. the local clock operating spuriously at one half or twice its normal frequency,) especially at system startup. A lock detector is described which may be configured to detect and correct this anomalous behavior.

DETAILED DESCRIPTION

Phase Locked Loops (PLLs) are well represented in the literature. A typical PLL is composed of a phase detector that compares an external reference signal to an internal clock signal, a low pass filter that smoothes the resulting error value to produce a clock control signal, and a variable frequency clock source (typically, a Voltage Controlled Oscillator or VCO) controlled by the smoothed error value, producing the internal clock signal presented to the phase detector. In a well-known variation, such a PLL design may incorporate a clock frequency divider between the VCO and the phase detector, allowing a higher-frequency clock output to be phase locked to a lower-frequency reference signal.

In an alternative embodiment, the variable frequency clock source is replaced by a variable delay element, its (optionally multiple tapped) outputs thus representing one or more successive time-delayed versions of the original input signal rather than successive cycles of an oscillator to be phase compared to the reference input signal. For the purposes of this document, such Delay Locked Loops (DLL) are considered functionally equivalent to a PLL in such an application.

Numerous forms of PLL phase detectors, also known as phase comparators, are known to the art. A popular embodiment is composed of a digital finite state machine with state changes driven by signal edges of the external reference clock and the internal clock signal. Such a state machine can be designed and configured to be sensitive to both phase differences between the two clock signals, and to gross frequency differences between those signals as well. In some embodiments, a state machine phase detector also provides an indication that the PLL has locked. The combination of phase and frequency sensitivity permits such a detector to accelerate the initial acquisition of PLL lock, e.g. at system startup, where the two clock signals may have significant frequency differences.

An edge-clocked D flip-flop may be used as a digital phase comparator, producing a "1" output if a first clock signal presented at the D input has already transitioned when a second clock signal used as the flip-flop clock transitions, and produces an "0" output if the first clock signal has not yet transitioned. Such "bang-bang" phase detector behavior (i.e. either fully on or fully off) may require significant smoothing by the PLL loop filter to maintain loop stability.

Figure 13:
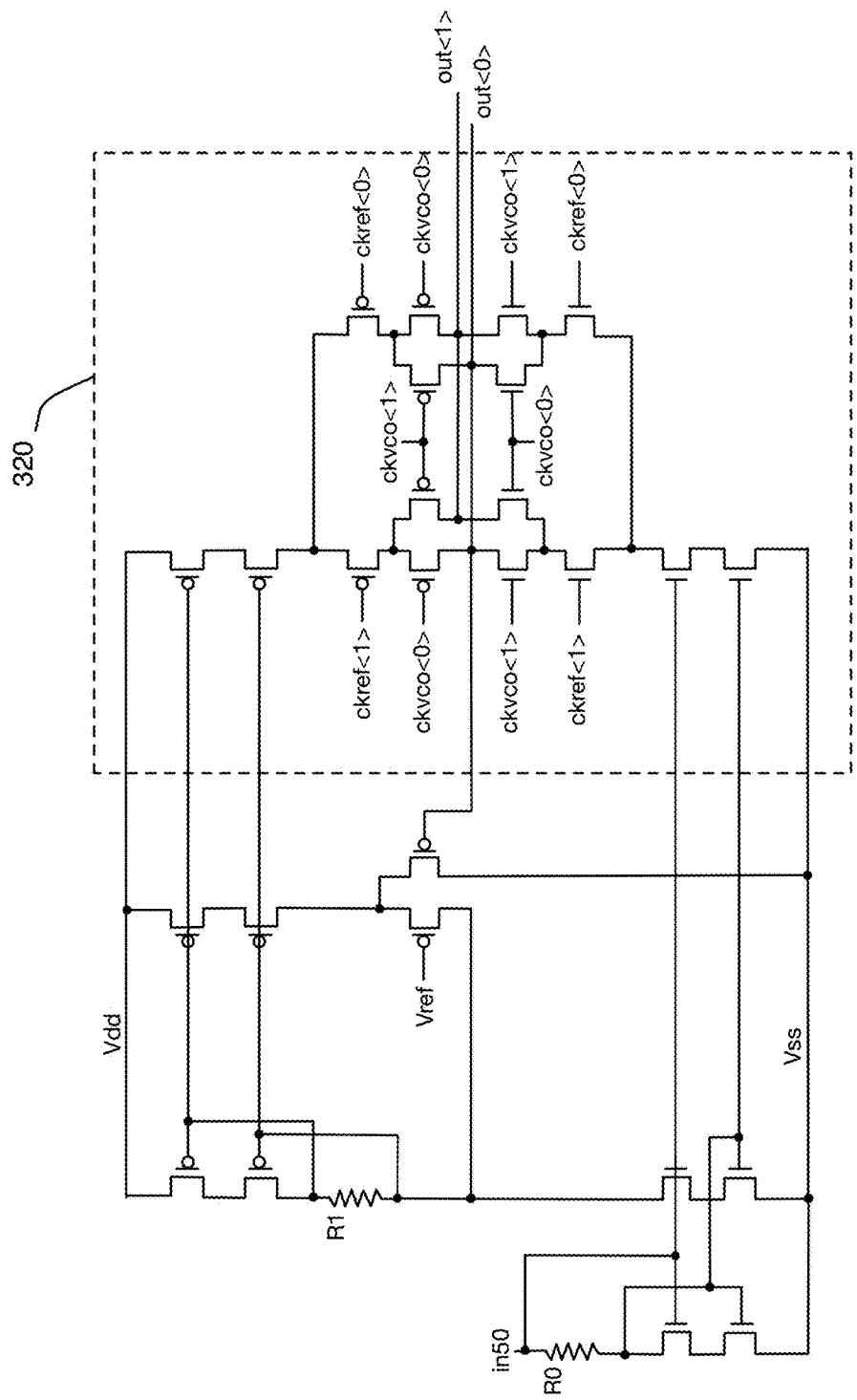
FIG. 13 is a schematic of an XOR gate, in accordance with some embodiments.

A simple XOR gate is also commonly used as a phase comparator in PLL embodiments in which its simple, low-latency design leads to advantageous high loop bandwidth. Unlike the previous example, the digital waveform produced by XORing, for example, a first and a second square wave clock signal smoothly varies its duty cycle with phase differences between the clocks. FIG. 13 is a schematic of an exemplary XOR 320 that may be used to generate a current-mode output. Also shown in FIG. 13 are biasing circuits that However, any such detector sensitive only to phase may erroneously drive the VCO in the wrong direction when there is significant frequency difference between the first and second clocks, such as at system startup, before ultimately capturing a phase relationship leading to PLL lock. In embodiments utilizing a VCO covering a broad frequency range, a phase-only detector may also allow the PLL to erroneously lock with the VCO operating at a multiple or fraction of the correct frequency. Such anomalous or pseudo-lock conditions may be avoided by use of a phase and frequency comparator as known in the art, such as the earlier example based on a finite state machine.

Unless otherwise specified within this document, a phase locked loop may be composed of any known embodiment of a phase detector, voltage controlled oscillator, and loop filter, without limitation.

Receiver Clock Recovery

Figure 2:
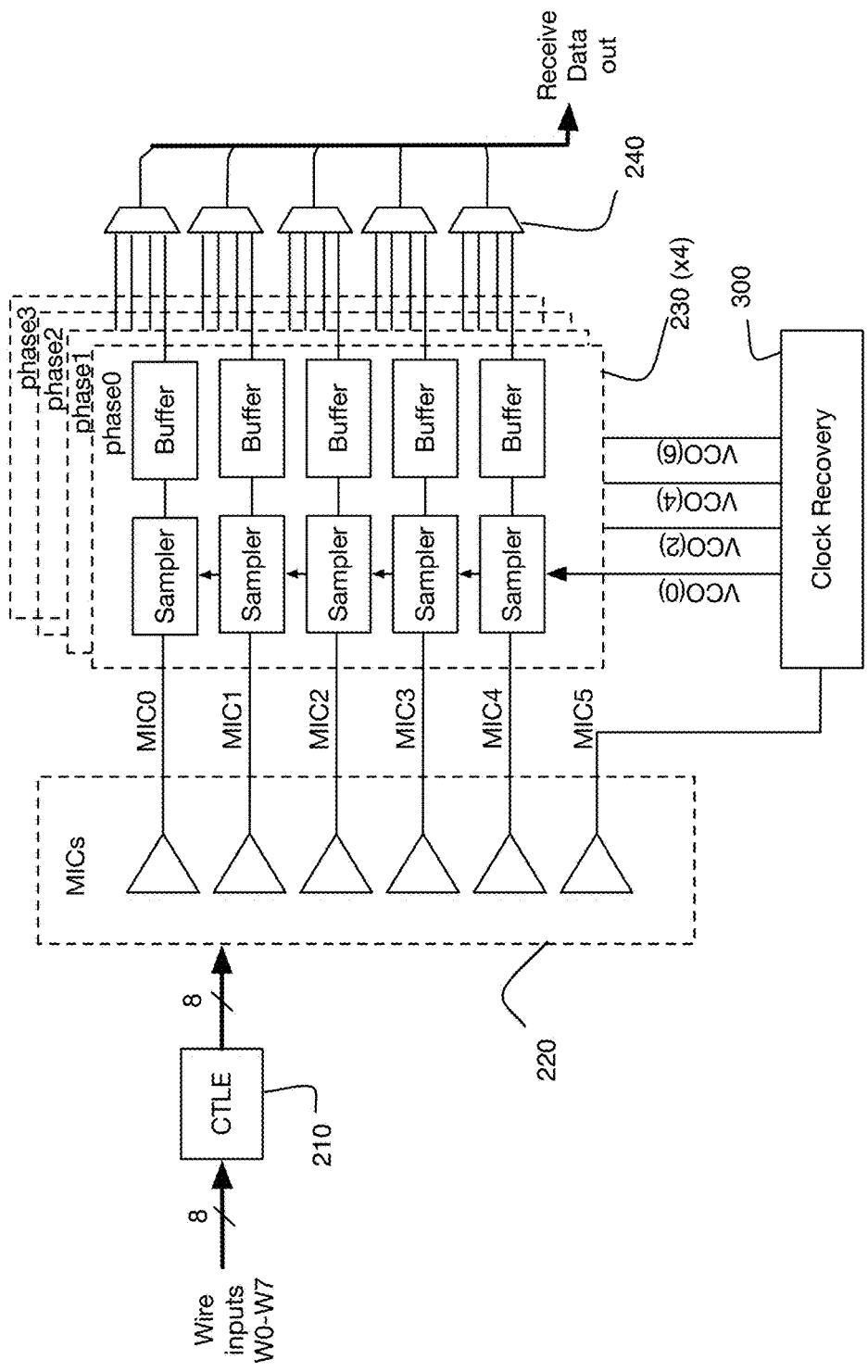
FIG. 2 is a block diagram of one embodiment of a receiver compatible with the transmitter of FIG. 1.
Figure 3:
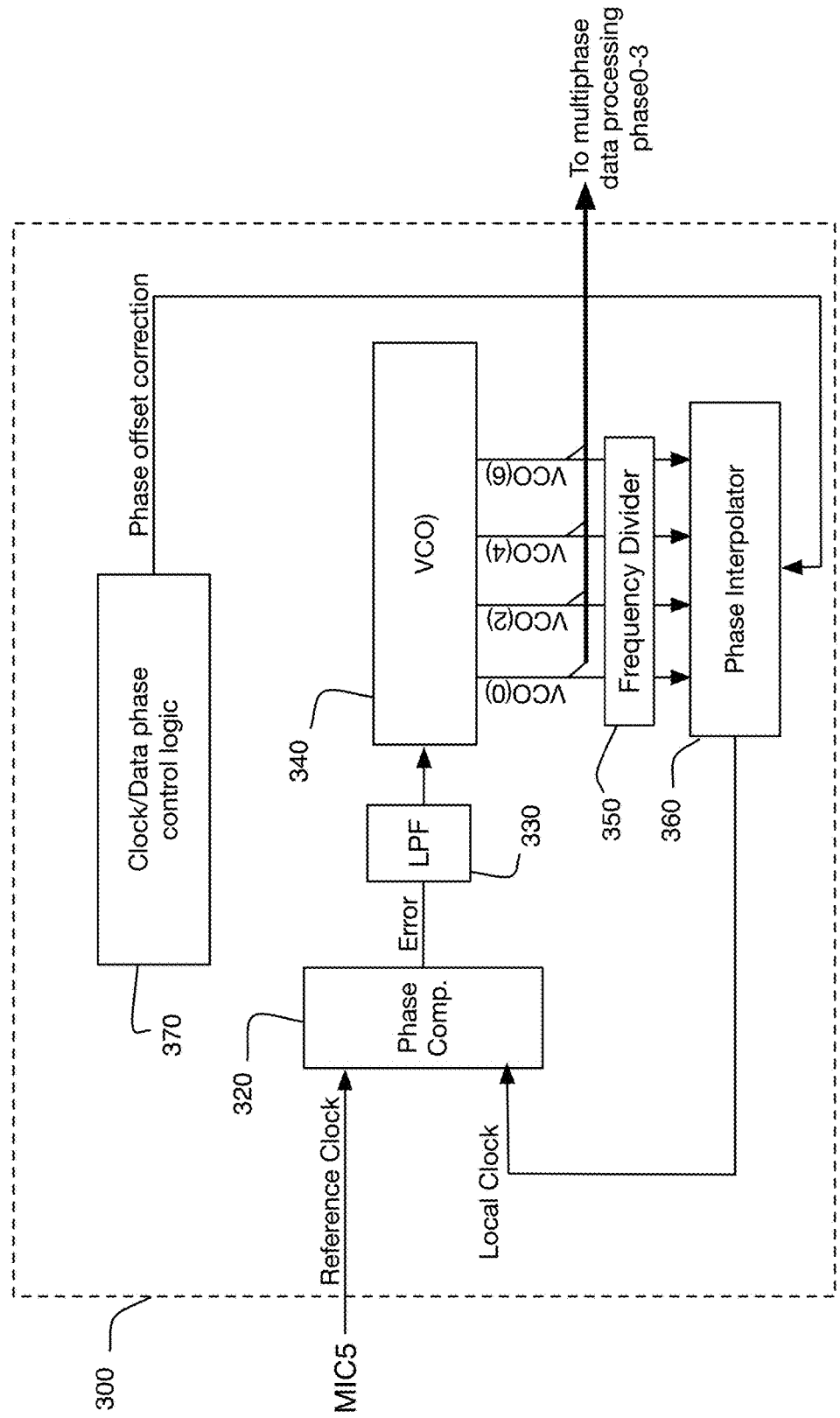
FIG. 3 is a block diagram detailing one embodiment of the clock recovery circuit used by the receiver of FIG. 2.

One data receiver embodiment FIG. 2 utilizes a PLL-based clock recovery subsystem as shown in FIG. 3. This PLL accepts the received clock signal MIC5 as the reference clock to which the locally-generated clocks will be phased locked. Phase Comparator 320 compares the reference clock to a local clock derived from Voltage Controlled Oscillator or VCO 340, producing an output which is low pass filtered 330 to provide an Error result which subsequently corrects the VCO operating frequency. In some embodiments, the outputs of Phase Comparator 320 is a digital waveform which is subsequently converted to an analog error signal, either through implicit or explicit digital to analog conversion, or by use of an interface element such as a charge pump. Some embodiments may combine such conversion with all or part of the low pass filtering operation, as one example offered without limitation by the digital filtering behavior shown by the switching action of a charge pump directed by digital control signals generating an analog signal output.

In one embodiment, a ring oscillator composed of a sequence of identical digital logic elements such as gates, inverters, or buffers in a closed loop is used as the internal Voltage Controlled Oscillator (VCO) timing source for the PLL. The ring oscillator frequency is varied by analog adjustment of at least one of: gate propagation delay, inter-gate rise and fall time, and gate switching threshold within the ring oscillator. In some embodiments, this is implemented via switched capacitor banks, where a digital control signal is applied to selectively place capacitive elements in parallel and/or series combinations to alter an RC time constant, as one non-limiting example. In further embodiments, one or more current sources within ring oscillator elements may be increased or decreased to alter that element's switching threshold and/or output rise-time/fall-time, and thereby adjust its effective delay.

In some embodiments, outputs are taken at equal intervals (i.e. separated by equal numbers of ring oscillator gates) along the sequence of gates comprising the ring oscillator to provide multiple clock phases, as identified here as VCO(0), VCO(2), VCO(4), and VCO(6) clocks. Some embodiments may also incorporate a phase interpolator 360 which, under control of Clock/Data phase control logic 370, can be configured to incrementally offset the fixed phase relationship obtained under lock conditions so as to align the resulting clock phases with desirable data sampling intervals. In some embodiments, it is desired that the VCO operate at a multiple of the received reference clock frequency, thus Frequency Divider 350 divides the VCO outputs by a comparable amount prior to the Phase Detector. As non-limiting examples, in one embodiment binary (factor of two) dividers are used at 350 to obtain the correct sampling clock rate, while in another embodiment no divider is required and the VCO outputs are used directly.

Adjustable ring oscillator VCOs are capable of a very wide operating range, in one embodiment demonstrating controlled oscillation over considerably more than a 4:1 frequency range, potentially allowing the PLL to erroneously lock at one-half the desired clock rate or at twice the desired clock rate. Combining the ring oscillator VCO with a phase- and frequency-detector such as the previously described State Machine phase detector to control startup frequency was contra-indicated in this embodiment, however, as that form of phase comparator could not provide sufficient PLL bandwidth during lock to meet phase jitter specifications.

Frequency Lock Assist

Figure 4:
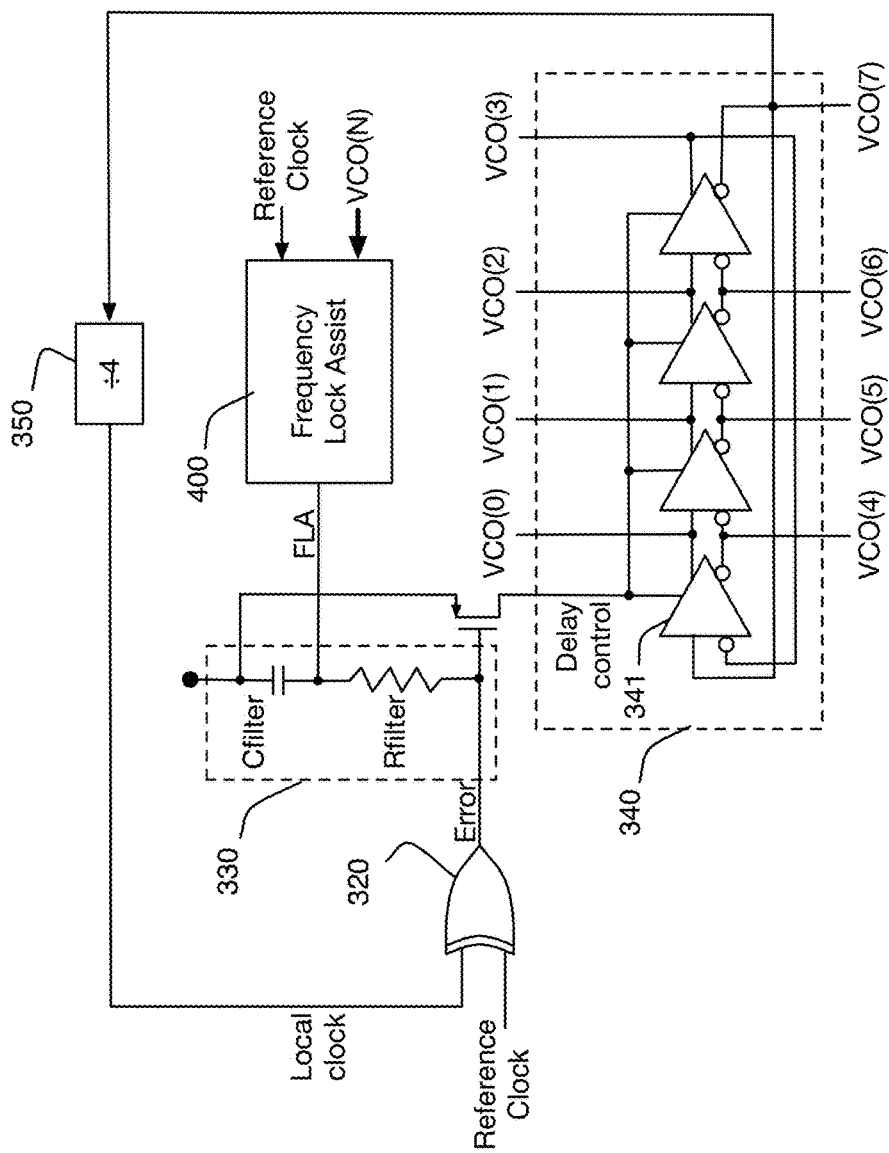
FIG. 4 shows details of the loop filter, VCO, and associated circuits of FIG. 3.

A new embodiment composed of the phase detector, error accumulator, and VCO elements of FIG. 3 is shown in FIG. 4. Without implying limitation, a ring of four differential buffer/inverter stages is shown serving as a voltage-controlled oscillator, with the propagation delay of each buffer/inverter stage controlled by control signal Delay Control. The four positive and four negative ring oscillator outputs provide eight distinct local clock signal output phases VCO (0) through VCO(7).

Also without implying limitation, an XOR gate phase detector producing a current output is illustrated at 320. Its simple design and low latency enables high PLL bandwidth and low jitter, but its lack of frequency discrimination introduces the risk of anomalous or pseudo-locked operation at system startup. To avoid such undesirable operation an additional source of VCO control, Frequency Lock Assist 400, is utilized to force the VCO into an operational range within which the normal phase comparator will correctly operate. The Frequency Lock Assist may also be configured to provide a useful PLL lock indication, independent of the type of phase detector used.

In the embodiment of FIG. 4, a VCO control signal including the control signal FLA produced by Frequency Lock Assist 400 is presented to an error accumulator circuit 330 shown in FIG. 4 as a PLL loop filter, without implying limitation. The FLA signal is presented as a current at the capacitive node, thus producing a first-order feedback loop during startup. In contrast, the phase-error signal produced by phase comparator 320 is presented to error accumulator circuit 430 via resistor Rfilter, producing a second-order feedback loop during normal PLL operation. In some embodiments, the FLA signal quickly charges/discharges the capacitor shown in the loop filter to set the VCO in a frequency-locked condition, and the phase-error signal subsequently fine-tunes the capacitor to set the VCO into a phase and frequency-locked condition. At least one embodiment powers down the circuitry associated with Frequency Lock Assist 400 once normal PLL lock (or Frequency lock condition) has been obtained to reduce system power utilization. Another alternative embodiment utilizes a digital or analog switch to select between Frequency Lock Assist 400 and normal phase comparator 320 as the source of loop control signal Error. In such embodiments, the switch may allow the FLA 400 to quickly set the VCO in a frequency-locked condition, and then the switch may switch to enable the phase-error signal to fine-tune the phase of the VCO. It should be noted that alternative embodiments may present the phase detection and FLA outputs to the same input of a PLL loop filter.

Figure 5:
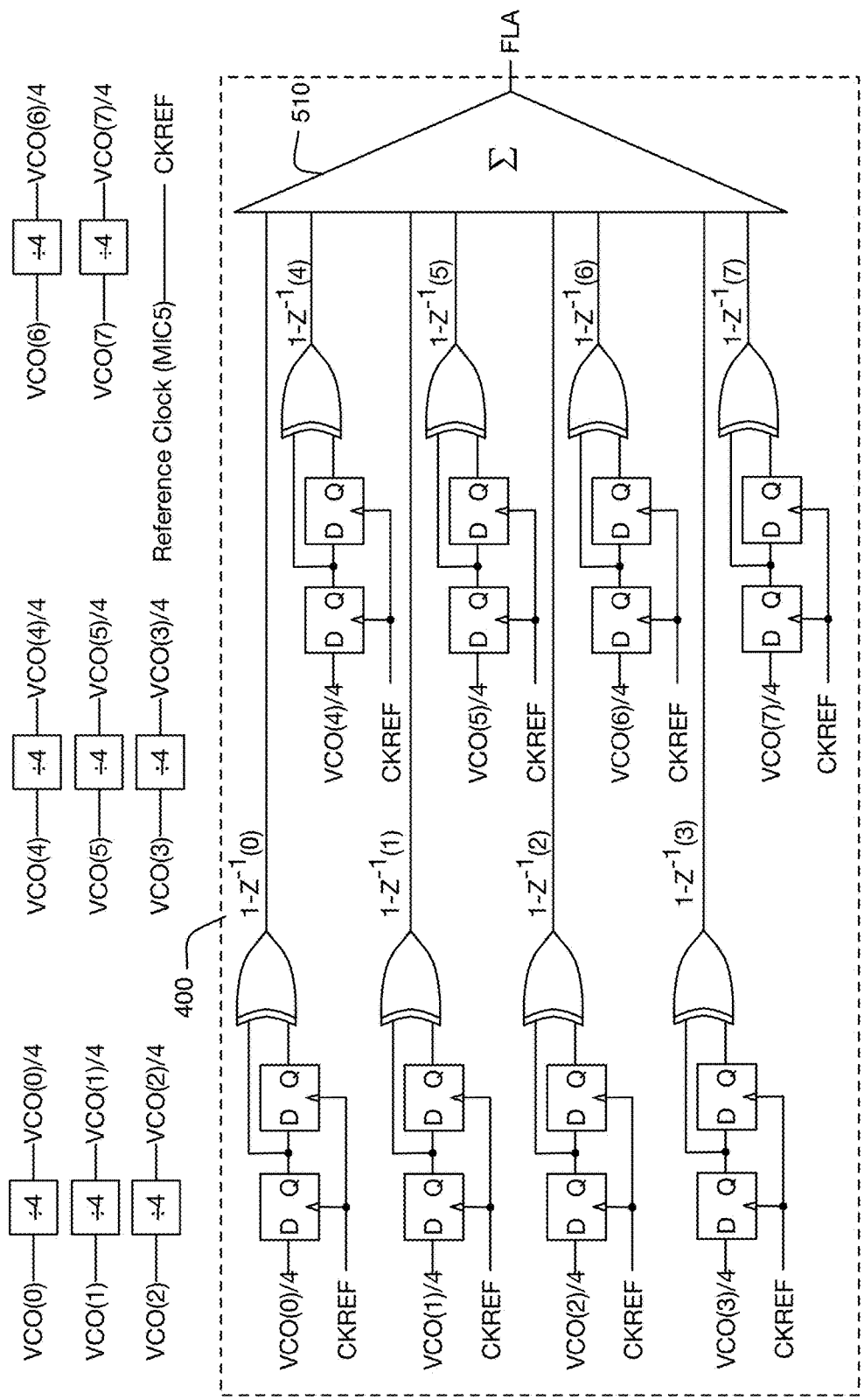
FIG. 5 is a schematic diagram of one embodiment of a Frequency Lock Assist circuit.
Figure 6A:
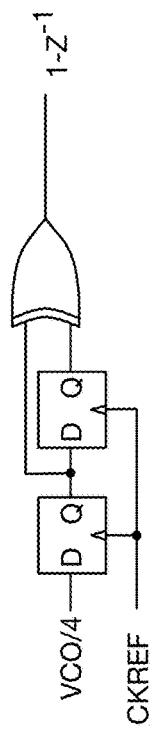
FIG. 6A shows one embodiment computing a $1-z^{-1}$ term of a Frequency Lock Assist circuit.

One embodiment of Frequency Lock Assist 400 is shown in detail in FIG. 5. As shown in FIG. 5, the FLA 400 includes a plurality of FLA sub-circuits as shown in FIG. 6A for computing frequency differences $1-z^{-1}$ by determining if a local clock phase (one example being the clock VCO(0)/4) derived from the local VCO clock has or has not changed state one or more times between consecutive ticks of the external reference signal CKREF/4. In this embodiment, eight distinct phases of the VCO local clock are individually used to compute a $1-z^{-1}$ term, the results of which are summed using a summation unit 510 to produce the resulting control output FLA. In one embodiment, 510 produces an analog summation of the smoothed analog level of its inputs; in other embodiments, the summation is performed digitally. One such embodiment utilizes XOR gates producing current-mode outputs, which may conveniently be summed at a common node to produce the FLA signal.

Figure 8:
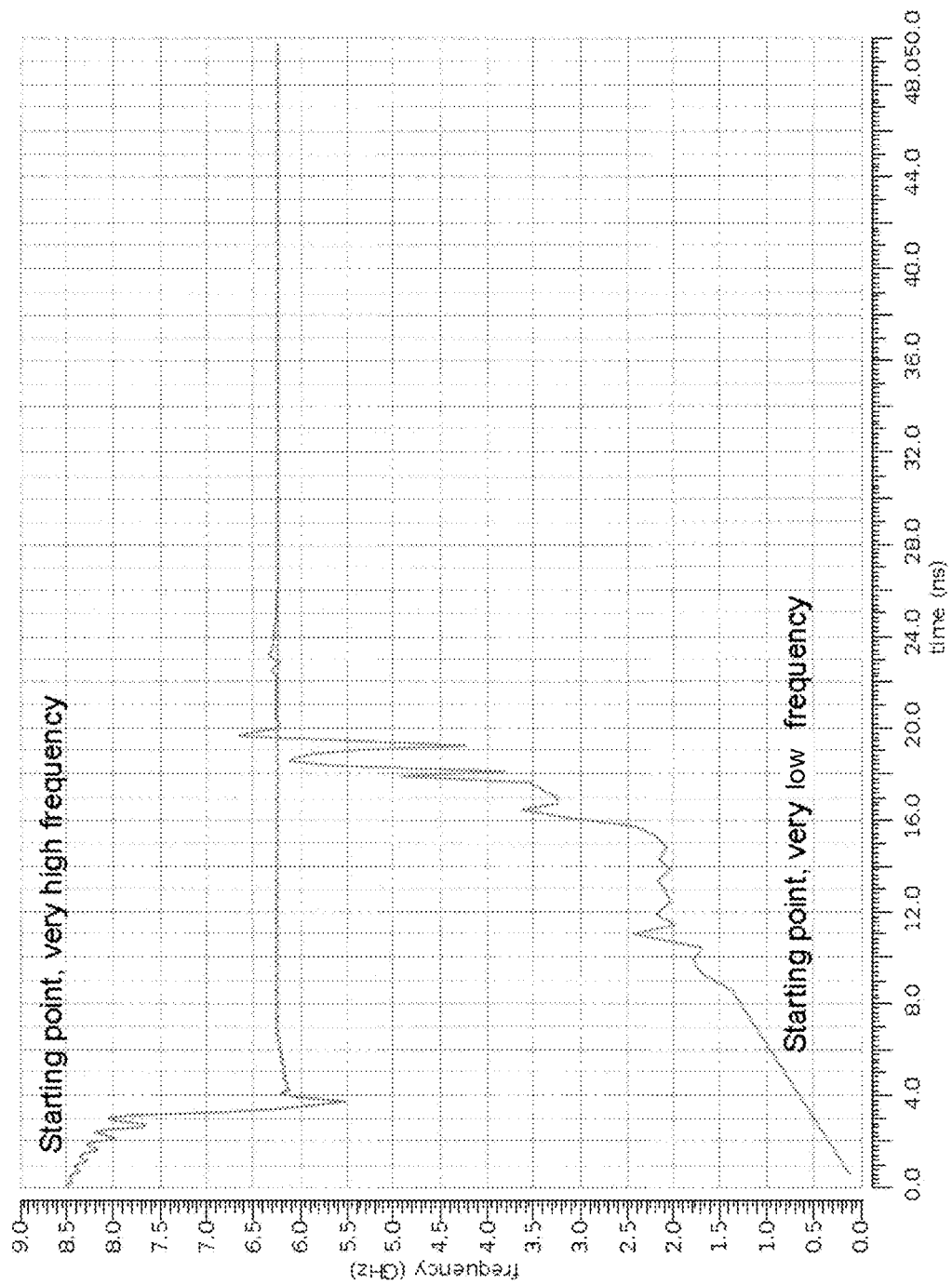
FIG. 8 is a diagram illustrating frequency-locking of a local clock signal, in accordance with some embodiments.

FIG. 8 illustrates the frequency of the VCO local clock signal over time, in accordance with some embodiments. As shown, the VCO local clock signal locks to a frequency of about 6.25 GHz. In some embodiments, CKREF may have a frequency of ~6.25 GHz, and at the receiver, multiple phases of a local clock signal VCO(0-7) are generated at ~6.25 GHz, which may be used to sample MIC outputs MIC0-MIC5 using samplers in processing phases 230, for example at a rate of ~25 GHZ. All numbers are provided for example only, and should not be considered limiting.

Figure 9:
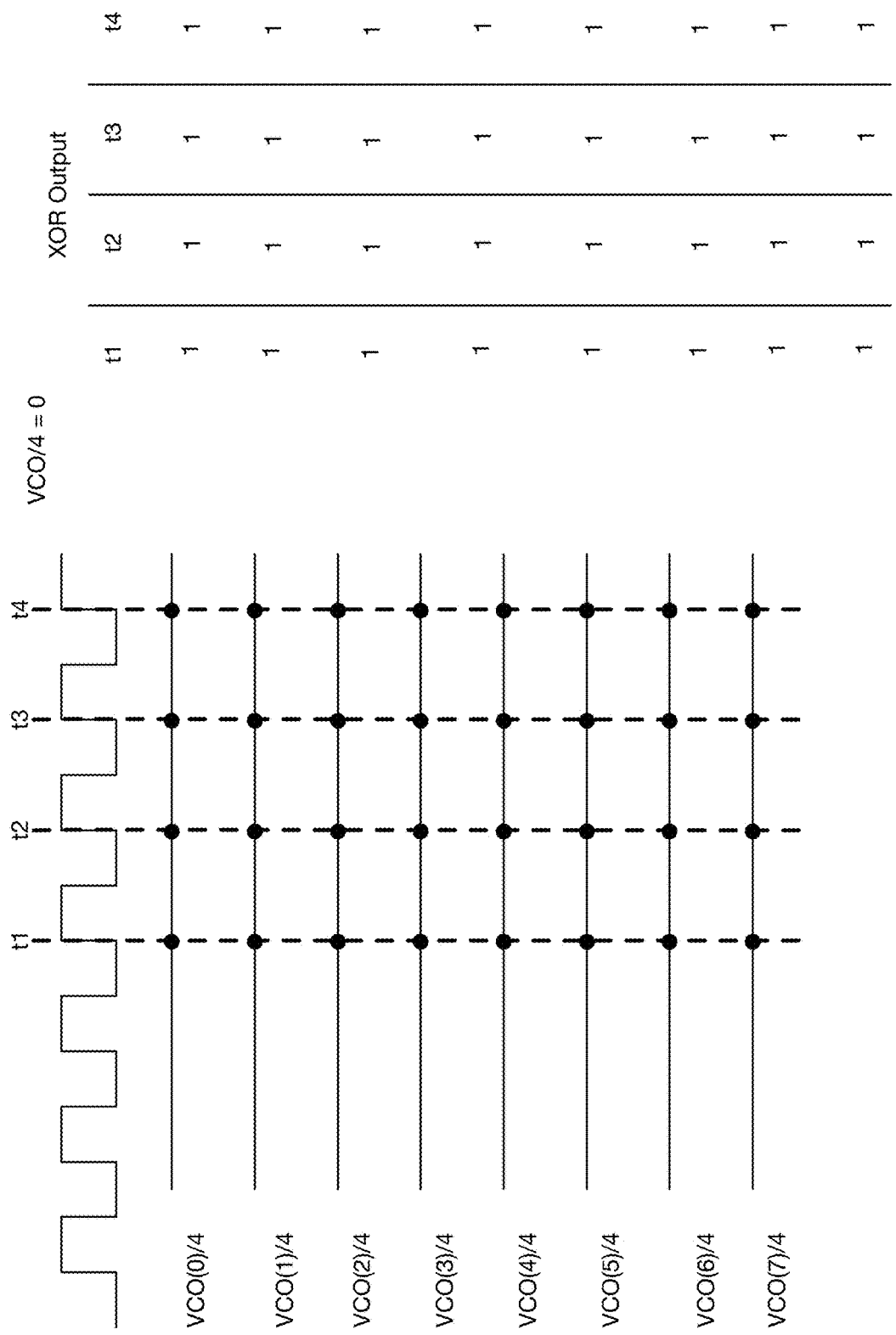
FIG. 9 is a diagram illustrating operation of a FLA circuit, in accordance with some embodiment.
Figure 10:
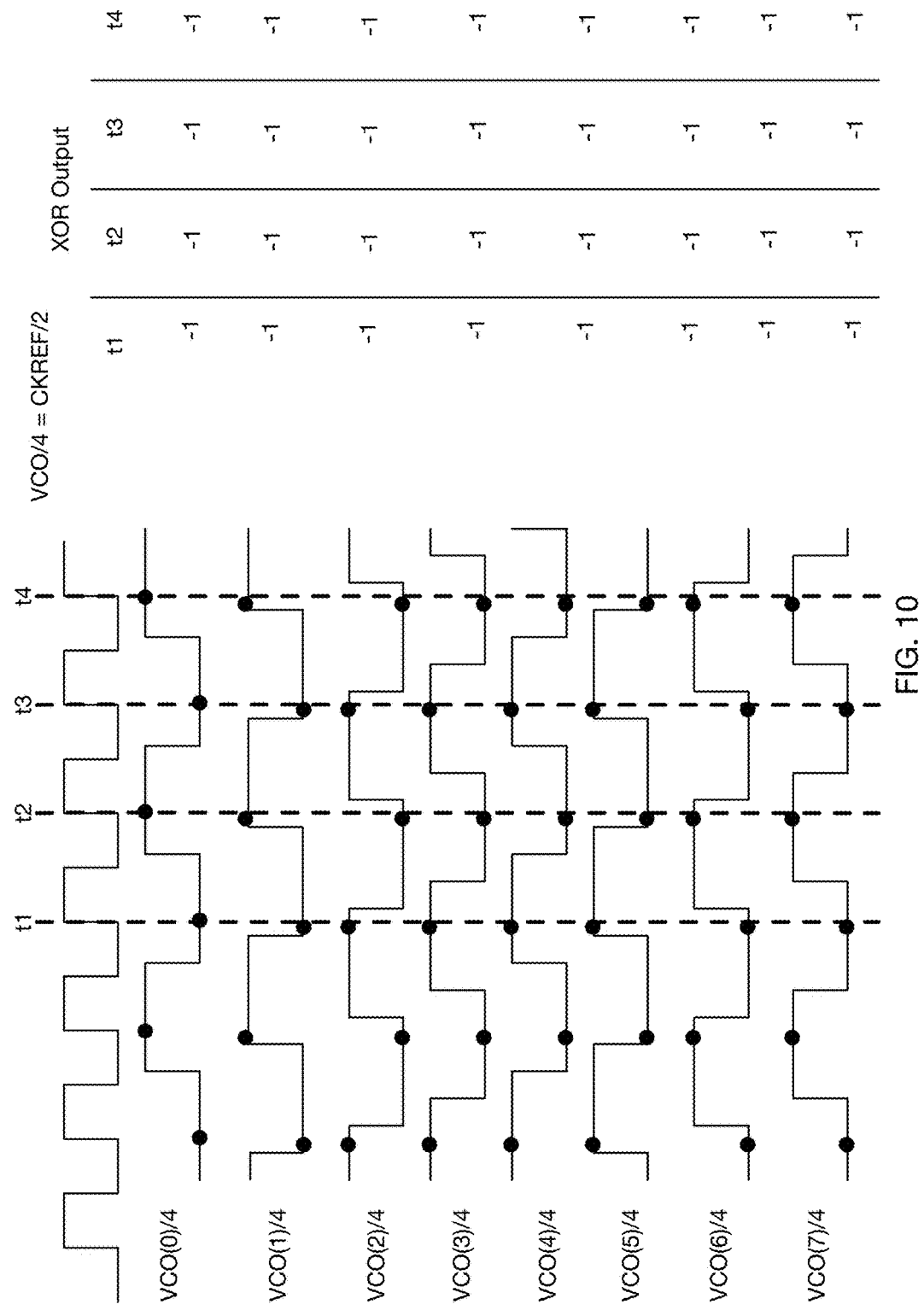
FIG. 10 is a diagram illustrating operation of a FLA circuit, in accordance with some embodiments.
Figure 11:
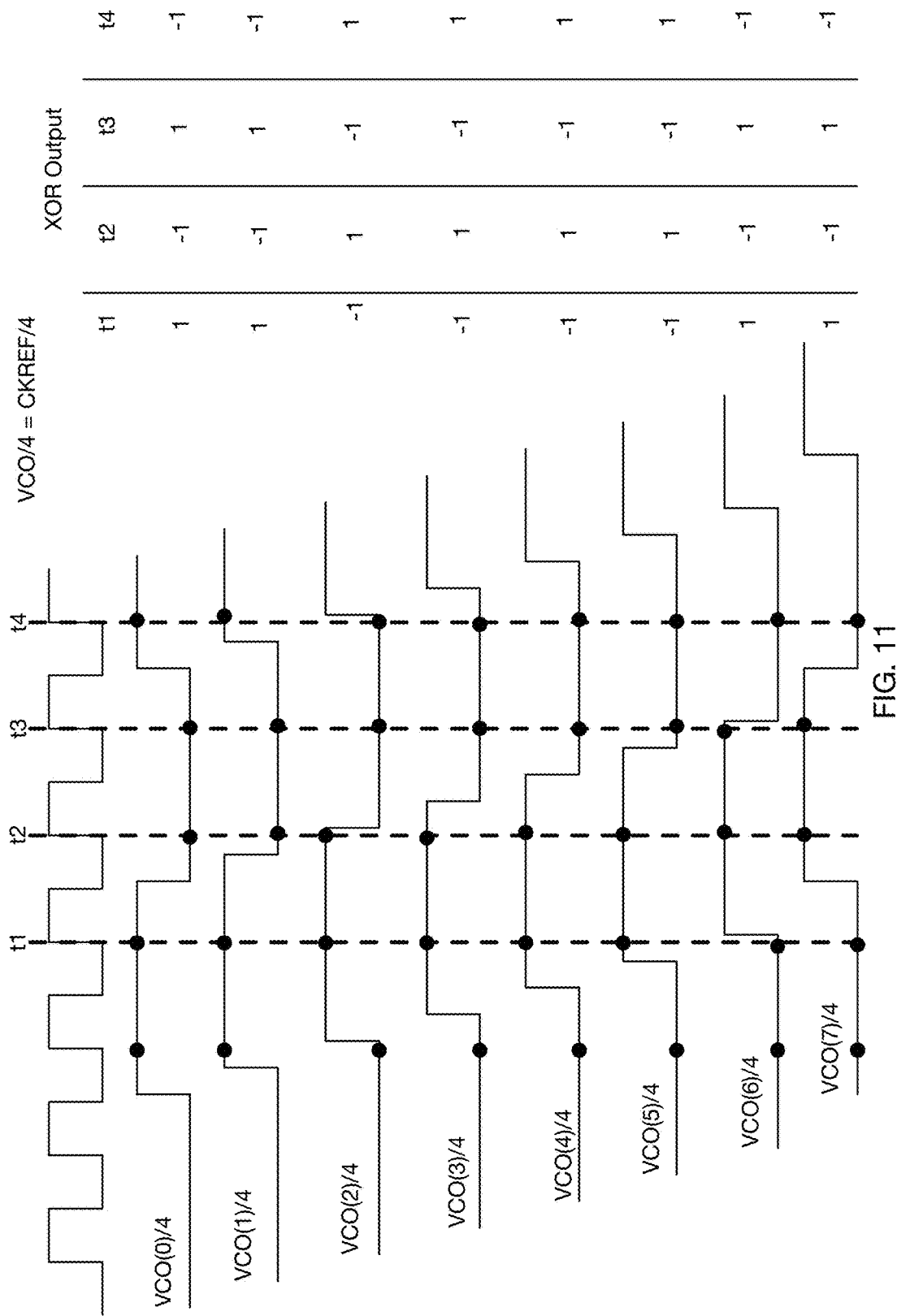
FIG. 11 is a diagram illustrating operation of a FLA circuit, in accordance with some embodiments.

FIGS. 9-11 illustrate the outputs of the XOR gates for each FLA sub-circuit, as shown in FIG. 5, according to various quartered VCO frequencies of VCO/4. FIG. 9 illustrates a scenario where VCO/4 is at an extreme low case of 0 Hz (a DC signal). As shown, at each sampling instant t1-t4, none of the latched values change from the previously latched value, and thus each XOR of each FLA sub-circuit outputs a current-mode '1' (in current-mode output) at each sampling instant, for a cumulative FLA signal value of 8.

FIG. 10 illustrates another extreme case, where VCO/4 is equal to CKREF/2. As shown, at each sampling instant t1-t4, each latched value changes from the previous latched value for each of the plurality of local clock phases, thus each XOR in each FLA sub-circuit outputs a current-mode '−1' value, for a cumulative FLA signal value of −8.

FIG. 11 illustrates an example of the FLA in frequency-locked condition. In some embodiments, the frequency-lock condition occurs when VCO/4 is equal to CKREF/4. As shown in FIG. 11, at any given sampling instant t1-t4, half of the previously latched values have changed from the current latched values, and thus half of the XOR outputs will be '1' while the other half will be '−1', resulting in a cumulative FLA signal value of 0.

Referring back to FIG. 5, it should be pointed out for clarity that in an embodiment, CKREF may have a frequency of 6.25 GHz. In some embodiments, CKREF may have been divided by some factor from an original symbol clock rate. In some embodiments, the original symbol rate may be equal to 25 GHz, in some embodiments. Such embodiments should not be considered limiting. Further, as each VCO phase is quartered prior to entering the FLA sub-circuits shown in FIG. 5, VCO/4 will equal 1.5625 GHz in lock condition (or CKREF/4, as described above with respect to FIG. 11), and thus the frequency of the VCO phases will be equal to 6.25 GHz, i.e. VCO=CKREF.

Further, it should be noted that in the examples described above, the maximum frequency that VCO could start is 2*CKREF (12.5 GHz in the specific example described above), as shown by the scenario of FIG. 10. If VCO>2*CKREF, the outputs of each FLA sub-circuit may be randomized, potentially giving an average FLA value of 0, which would indicate lock condition.

It should be noted that the above numerical examples are provided purely for example, and should not be considered in any way as limiting the scope of described embodiments.

In some embodiments, an apparatus includes a VCO 340 configured to provide a plurality of phases VCO(N) of a local clock signal. A phase comparator 320 is configured to receive a phase VCO(i) of the local clock signal and a reference clock signal CKREF, and configured to output a phase-error signal. An FLA circuit 400 is configured to receive one or more phases VCO(N) of the local clock signal and the reference clock signal, and to generate an FLA signal indicative of a magnitude of a frequency error between the reference clock signal CKREF and the local clock signal. The apparatus further includes an error accumulator circuit 430 configured to receive the phase-error signal and the FLA signal, and to responsively provide to the VCO 340 a VCO control signal to lock the local clock signal to the reference clock signal.

In some embodiments, the error accumulator circuit 430 is a loop filter. In some embodiments, the phase-error signal is received at a second-order input of the loop filter and wherein the FLA signal is received at a first-order input of the loop filter. In some embodiments, the loop filter is a resistor-capacitor (RC) filter, and the second-order input is at a resistive input of the RC filter and the first-order input is at a capacitive input of the RC filter.

In some embodiments, the FLA signal is configured to set the VCO 340 in a frequency-lock condition, and subsequently the phase-error signal sets the VCO 340 in a frequency and phase-locked condition.

In some embodiments, the VCO 340 comprises a delay-control transistor, and the VCO control signal sets an operating voltage for the delay-control transistor. In some embodiments, the delay-control transistor adjusts delay characteristics of delay elements in the VCO 340. In some embodiments, the delay-control transistor is configured to adjust an RC time-constant of at least one delay element. In some embodiments, the delay-control transistor is configured to adjust a current through the delay elements in the VCO.

In some embodiments, FLA circuit 400 includes a plurality of FLA sub-circuits, each FLA sub-circuit configured to receive (i) a respective phase of the plurality of phases of the local clock signal and (ii) the reference clock signal, and to output a partial FLA signal, and a summation unit configured to receive each partial FLA signal and to generate the FLA signal.

In some embodiments, each partial FLA signal is a current signal and the summation unit performs an analog summation at a common node connected to all of the FLA partial signals. In some embodiments, the FLA circuit comprises 8 FLA sub-circuits, and the FLA signal has a range of values from −8 to +8.

In some embodiments, each FLA sub-circuit is a first order sub-circuit, each sub-circuit includes a first and a second D Flip-Flop arranged in a shift register configuration, the first and second D Flip-Flops configured to latch values of the respective phase of the local clock signal according to adjacent edges the reference clock signal, and an XOR connected to the output of each D Flip-Flop, the XOR configured to receive the latched values and to generate the partial FLA signal. An example of such an FLA sub-circuit is shown in FIG. 6A.

Figure 6B:
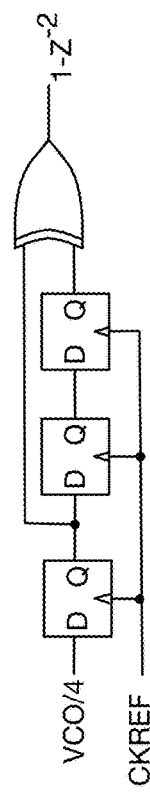
FIG. 6B shows one embodiment computing a $1-z^{-2}$ term of a Frequency Lock Assist circuit.

In some embodiments, each FLA sub-circuit is a second order circuit, each sub-circuit including three D Flip-Flops arranged in a shift register configuration, a first and third D Flip-Flop configured to latch values of the respective phase of the local clock signal according to edges of the reference clock signal that are separated by a unit interval, and an XOR connected to the first and the third D Flip-Flop, the XOR configured to receive the latched values and to generate the partial FLA signal. An example of such an FLA sub-circuit is shown in FIG. 6B.

Figure 1:
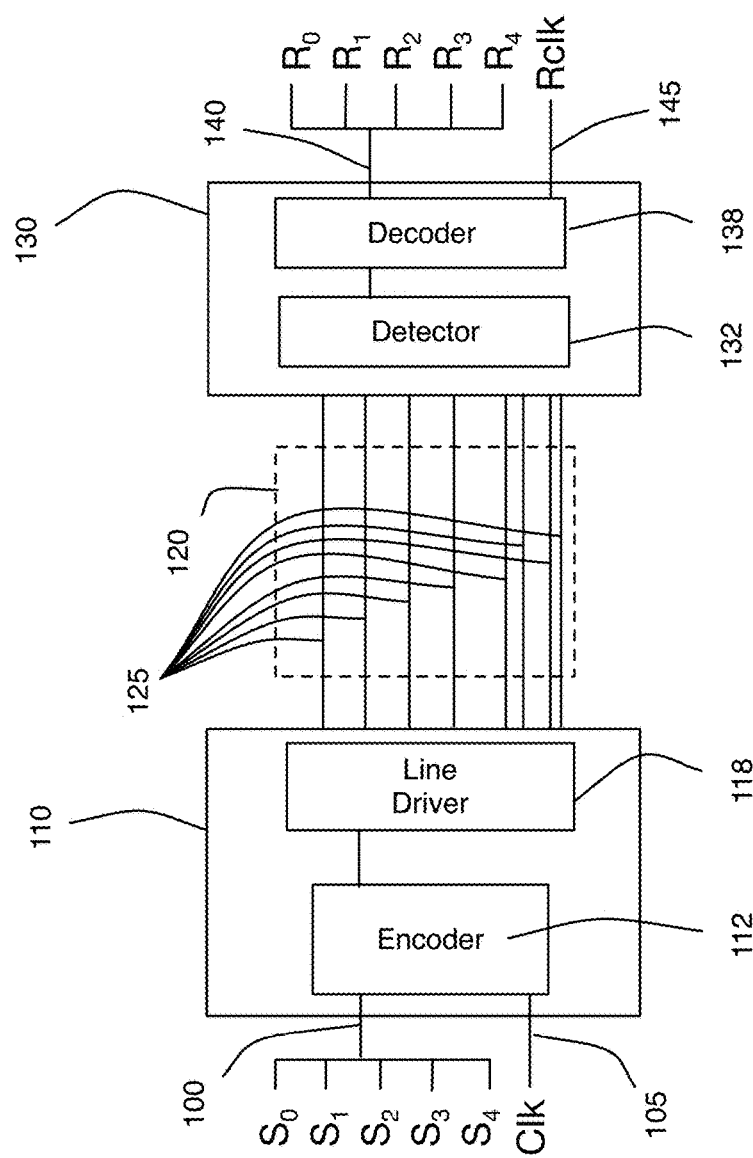
FIG. 1 is a block diagram of one embodiment capable of encoding and transmitting five data bits and a clock on an eight wire communications channel.
Figure 7:
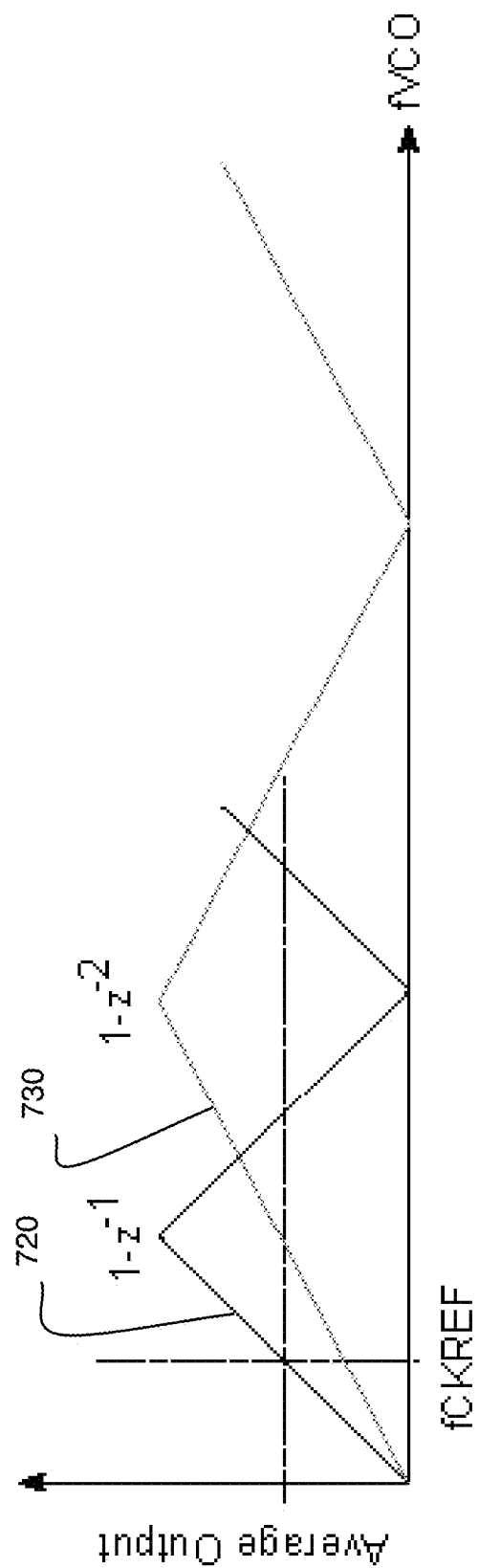
FIG. 7 is a graph showing the transfer functions of $1-z^{-1}$ and $1-z^{-2}$ terms of a Frequency Lock Assist (FLA) circuit.

It should be noted that embodiments described above compute $1-z^{-1}$ based on the reference clock rate, comparing it to the VCO clock rate divided by four. However, in the particular example of the communications system of FIG. 1, the clock signal is transmitted at one-half the data rate, (i.e. a divide-by-two action is performed at the transmitter.) Thus, as shown in FIG. 5, the Reference Clock received as MIC5 is effectively CKREF. The corresponding VCO frequencies VCO(N) are divided by four to produce the corresponding local clock comparison signals. The resulting transfer characteristic of the FLA is shown as 720 in FIG. 7.

Assuming that the maximum VCO frequency that may transiently occur at startup (2*CKREF) results in each of VCO(N)/4 in FIG. 4 completing a full square wave cycle between consecutive rising edges of clock CKREF, every XOR gate will produce an output $1-Z^{-1}(N)$ that is true (e.g., '−1' in current-mode output), thus the cumulative FLA will be at a maximum. Conversely, a minimum VCO frequency (e.g., 0 Hz) results in none of VCO(N)/4 changing between consecutive rising edges of CKREF, causing every XOR gate to produce a false output (e.g., '1' in current-mode output), resulting in a minimum cumulative FLA. At or near the PLL lock frequency (VCO=CKREF), approximately half of the XOR gates will detect that their corresponding VCO(N)/4 has changed, thus the cumulative FLA will be half way between its maximum and minimum values. In an alternative embodiment, the above values may be inverted, in which the FLA signal may be +V at maximum, −V at minimum, and PLL lock will be a value of zero.

If the operational frequency range of the VCO is even wider, a Frequency Lock Assist circuit utilizing $1-z^{-2}$ terms or even higher order terms may be used. As shown as 730 in FIG. 7, the positive slope of these second-order terms extends over a wider frequency range. The overall circuit is as shown in FIG. 4, except the individual terms are computed using the second-order FLA sub-circuit of FIG. 6B rather than the first-order FLA sub-circuit of FIG. 6A.

Figure 12:
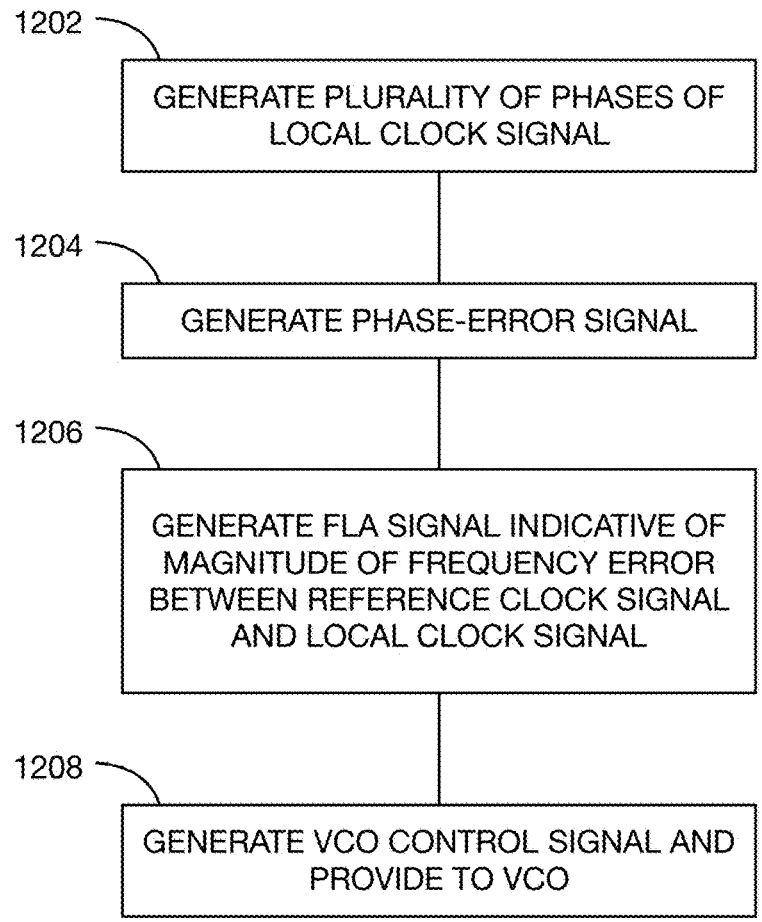
FIG. 12 is a flowchart of a method, in accordance with some embodiments.

FIG. 12 illustrates a flowchart of a method 1200, in accordance with some embodiments. As shown, method 1200 includes generating, at block 1202, using a voltage-controlled oscillator (VCO), a plurality of phases of a local clock signal. At block 1204, the method generates a phase-error signal using a phase comparator receive a phase of the local clock signal and a reference clock signal, and configured to output the phase-error signal. At block 1206, the method generates a frequency-lock assist (FLA) signal using a FLA circuit receiving one or more phases of the local clock signal and the reference clock signal, the FLA signal indicative of a magnitude of a frequency error between the reference clock signal and the local clock signal. At block 1208, the method generates a VCO control signal using an error accumulator circuit receiving the phase-error signal and the FLA signal, and responsively providing the VCO control signal to the VCO to lock the local clock signal to the reference clock signal.

In some embodiments, the error accumulator circuit is a loop filter. In some embodiments, the method further includes receiving the phase-error signal at a second-order input of the loop filter and receiving the FLA signal at a first-order input of the loop filter.

In some embodiments, the loop filter is a resistor-capacitor (RC) filter, the second-order input is at a resistive input of the RC filter and the first-order input is at a capacitive input of the RC filter.

In some embodiments, the FLA signal sets the VCO in a frequency-lock condition, and subsequently the phase-error signal sets the VCO in a frequency and phase-locked condition.

In some embodiments, the VCO control signal sets an operating voltage for a delay-control transistor in the VCO. In some embodiments, the method further includes adjusting the delay-control transistor to delay characteristics of delay elements in the VCO. In some embodiments, the method further includes adjusting an RC time-constant of at least one delay element in the VCO. In some embodiments, the method further includes adjusting current through at least one delay element in the VCO.

In some embodiments, the method 1200 further includes receiving, at a FLA sub-circuit of a plurality of FLA sub-circuits, a respective phase of the plurality of phases of the local clock signal and the reference clock signal, and responsively forming a partial FLA signal, and generating the FLA signal by summing the partial FLA signal from each FLA sub-circuit using a summation unit.

In some embodiments, each FLA sub-circuit is a first order sub-circuit, and generating each partial FLA circuit includes latching values of the respective phase of the local clock signal according to adjacent edges the reference clock signal and generating the partial FLA signal based on the latched values.

In some embodiments, each FLA sub-circuit is a second order circuit, and generating each partial FLA circuit includes latching values of the respective phase of the local clock signal according to edges of the reference clock signal that are separated by a unit interval and generating the partial FLA signal based on the latched values.

In some embodiments, each partial FLA signal is a current signal and wherein generating the FLA signal includes performing an analog summation at a common node connected to all of the FLA partial signals. In some embodiments, the FLA circuit comprises 8 FLA sub-circuits as shown in FIG. 5, and the FLA signal has a range of values from −8 to +8.

The invention claimed is:

1. A method comprising:
    obtaining a plurality of phases of a local clock signal from a voltage-controlled oscillator (VCO) comprising a plurality of sequentially-connected logic elements, each phase obtained via an output of a respective logic element;
    generating a frequency-lock assist (FLA) signal by detecting transitions in each phase of the plurality of phases of the local clock signal in adjacent sampling instants determined by a reference clock signal, the FLA signal indicative of a magnitude of a frequency error between the local clock signal and the reference clock signal; and
    applying the FLA signal to an error accumulation circuit, the error accumulation circuit generating a VCO control signal for setting the VCO in a frequency-locked condition based at least on the FLA signal.

2. The method of claim 1, wherein the FLA signal is applied to a first-order input of the error accumulation circuit.

3. The method of claim 2, wherein the first-order input is a capacitive input of an RC filter in the error accumulation circuit.

4. The method of claim 1, wherein setting the VCO in the frequency-locked condition comprises adjusting gate propagation delay of the plurality of sequentially-connected logic elements.

5. The method of claim 1, wherein setting the VCO in the frequency-locked condition comprises adjusting inter-gate rise and fall time of the plurality of sequentially-connected logic elements.

6. The method of claim 1, further comprising setting the VCO in a phase-locked condition based on a phase error signal generated by a phase comparator operating on a phase of the plurality of phases of the local clock signal and the reference clock signal.

7. The method of claim 6, further comprising providing the phase-error signal to a second-order input of the error accumulation circuit.

8. The method of claim 1, wherein generating the FLA signal comprises generating a plurality of partial FLA signals, and forming a summation of the plurality of partial FLA signals to generate the FLA signal.

9. The method of claim 8, wherein each partial FLA signal is formed by a respective FLA sub-circuit operating on (i) the reference signal and (ii) a respective phase of the plurality of phases of the local clock signal.

10. The method of claim 1, further comprising low-pass filtering the VCO control signal.

11. An apparatus comprising:
a voltage-controlled oscillator (VCO) comprising a plurality of sequentially-connected logic elements, the VCO configured to provide a plurality of phases of a local clock signal, each phase provided via an output of a respective logic element of the plurality of sequentially-connected logic elements;
a frequency-lock assist (FLA) circuit configured to generate an FLA signal by detecting transitions in each phase of the plurality of phases of the local clock signal in adjacent sampling instants determined by a reference clock signal, the FLA signal indicative of a magnitude of a frequency error between the local clock signal and the reference clock signal; and
an error accumulation circuit configured to receive the FLA, the error accumulation circuit configured to generate a VCO control signal to set the VCO in a frequency-locked condition based at least on the received FLA signal.

12. The apparatus of claim 11, wherein the error accumulation circuit is configured to receive the FLA signal at a first-order input.

13. The apparatus of claim 12, wherein the first-order input is a capacitive input of an RC filter in the error accumulation circuit.

14. The apparatus of claim 11, wherein the VCO control signal is configured to adjust gate propagation delay of the plurality of sequentially-connected logic elements to set the VCO in the frequency-locked condition.

15. The apparatus of claim 11, wherein the VCO control signal is configured to adjust inter-gate rise and fall time of the plurality of sequentially-connected logic elements to set the VCO in the frequency-locked condition.

16. The apparatus of claim 11, further comprising a phase comparator configured to receive a phase of the plurality of phases of the local clock signal and the reference signal and to responsively generate a phase-error signal representing a phase-offset between the phase of the plurality of phases of the local clock signal and the reference signal, the phase-error signal provided to the error accumulation circuit.

17. The apparatus of claim 16, wherein the error accumulation circuit comprises a second-order input configured to receive the phase-error signal.

18. The apparatus of claim 11, wherein the FLA circuit comprises a plurality of FLA sub-circuits, the plurality of FLA sub-circuits configured to generate a plurality of partial FLA signals, and wherein the FLA circuit is configured to form a summation of the plurality of partial FLA signals to generate the FLA signal.

19. The apparatus of claim 18, wherein each partial FLA signal is formed by a respective FLA sub-circuit operating on (i) the reference signal and (ii) a respective phase of the plurality of phases of the local clock signal.

20. The apparatus of claim 11, further comprising a low-pass filter configured to low-pass filter the VCO control signal.

* * * * *